United States Patent
Yagyu et al.

(10) Patent No.: US 10,347,604 B2
(45) Date of Patent: Jul. 9, 2019

(54) METHOD OF MANUFACTURING SEMICONDUCTOR DEVICE

(71) Applicant: Renesas Electronics Corporation, Tokyo (JP)

(72) Inventors: Yuki Yagyu, Tokyo (JP); Seiya Isozaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/900,919

(22) Filed: Feb. 21, 2018

(65) Prior Publication Data

US 2018/0277511 A1  Sep. 27, 2018

(30) Foreign Application Priority Data

Mar. 27, 2017 (JP) ................. 2017-061806

(51) Int. Cl.
| | |
|---|---|
| H01L 21/56 | (2006.01) |
| H01L 23/00 | (2006.01) |
| H01L 29/792 | (2006.01) |
| H01L 27/11517 | (2017.01) |

(52) U.S. Cl.
CPC ............ H01L 24/85 (2013.01); H01L 21/56 (2013.01); H01L 24/05 (2013.01); H01L 24/48 (2013.01); *H01L 27/11517* (2013.01); *H01L 29/792* (2013.01); *H01L 2224/023* (2013.01); *H01L 2224/04042* (2013.01); *H01L 2224/05084* (2013.01); *H01L 2224/05147* (2013.01); *H01L 2224/05155* (2013.01); *H01L 2224/05164* (2013.01); *H01L 2224/05166* (2013.01); *H01L 2224/05171* (2013.01); *H01L 2224/05644* (2013.01); *H01L 2224/45147* (2013.01); *H01L 2224/4845* (2013.01)

(58) Field of Classification Search
None
See application file for complete search history.

(56) References Cited

U.S. PATENT DOCUMENTS

| | | | |
|---|---|---|---|
| 8,309,164 B2 | 11/2012 | Imai et al. | |
| 9,406,628 B2 | 8/2016 | Matsumoto et al. | |
| 2002/0081850 A1* | 6/2002 | Kobayashi | C23C 14/046 438/689 |
| 2010/0133688 A1* | 6/2010 | Shigihara | H01L 24/46 257/738 |
| 2010/0320156 A1* | 12/2010 | Olaiya | C02F 1/30 210/748.1 |
| 2013/0299956 A1* | 11/2013 | Narita | H01L 21/561 257/676 |
| 2014/0210060 A1* | 7/2014 | Nakamata | H01L 24/49 257/666 |
| 2017/0162533 A1* | 6/2017 | Haga | H01L 24/05 |

FOREIGN PATENT DOCUMENTS

| | | |
|---|---|---|
| JP | 2008-311316 A | 12/2008 |
| JP | 2014-187073 A | 10/2014 |

* cited by examiner

*Primary Examiner* — Thien F Tran
(74) *Attorney, Agent, or Firm* — McDermott Will & Emery LLP

(57) ABSTRACT

To provide a semiconductor device having improved reliability. A method of manufacturing the semiconductor device includes connecting a wire comprised of copper with a conductive layer formed on the pad electrode of a semiconductor chip, heat treating the semiconductor chip, and then sealing the semiconductor chip and the wire with a resin.

10 Claims, 22 Drawing Sheets

FIG. 24

| THICKNESS OF Au FILM | BAKING CONDITIONS | |
|---|---|---|
| | 250°C, 16h | 250°C, 32h |
| 1.0 μm | 5at% | 7at% |
| 1.5 μm | 0at% | 2at% |
| 2.0 μm | 0at% | 0at% |

METHOD OF MANUFACTURING SEMICONDUCTOR DEVICE

CROSS-REFERENCE TO RELATED APPLICATIONS

The disclosure of Japanese Patent Application No. 2017-061806 filed on Mar. 27, 2017 including the specification, drawings, and abstract is incorporated herein by reference in its entirety.

BACKGROUND

The present invention relates to a method of manufacturing a semiconductor device. In particular, the invention pertains to a technology effective when applied to a method of manufacturing a semiconductor device including connecting a copper wire with the surface of a pad electrode via a conductive layer.

Japanese Unexamined Patent Application Publication No. 2014-187073 (Patent Document 1) disclose a technology of forming a plating film on a pad electrode made of an Al—Cu alloy film, connecting a copper wire to the plating film, and thereby electrically connecting the pad electrode with the copper wire. The plating film is comprised of an OPM film OP1 as a lower layer and an OPM film OP2 as an upper layer. As the OPM film OP1, disclosed is an Ni film, a Ti film, a Cr film, or the like and as the OPM film OP2, disclosed is a Pd film, an Au film, or the like.

Japanese Unexamined Patent Application Publication No. 2008-311316 (Patent Document 2) relates to a technology of mounting a semiconductor chip on a ceramic substrate having thereon a metallization layer made of a refractory metal and connecting the semiconductor chip with the metallization layer via a wire. This document discloses a technology of interposing a diffusion prevention plating layer between a nickel plating layer and a gold plating layer formed on the metallization layer and thereby improving the connection strength of the wire.

[Patent Document 1] Japanese Unexamined Patent Application Publication No. 2014-187073
[Patent Document 2] Japanese Unexamined Patent Application Publication No. 2008-311316

SUMMARY

The present inventors have investigated a semiconductor device obtained by sealing, with a resin, a semiconductor chip having a pad electrode. An input/output terminal of the semiconductor device is electrically connected with the pad electrode of the semiconductor chip via a wire. This wire is electrically connected with the pad electrode via a conductive layer made of a metal formed on the pad electrode.

The semiconductor device described above is desired to have improved reliability.

Another problem and a novel feature will be apparent from the description herein and accompanied drawings.

A method of manufacturing a semiconductor device according to one embodiment includes connecting a wire comprised of copper with a conductive layer formed on the pad electrode of a semiconductor chip, heat treating the semiconductor chip, and then sealing the semiconductor chip and the wire with a resin.

According to the one embodiment, a semiconductor device having improved reliability can be provided.

BRIEF DESCRIPTION OF THE DRAWINGS

FIG. 24 is a table showing the relation between the thickness of a gold film and baking conditions in the present embodiment;

DETAILED DESCRIPTION

Figure 1:
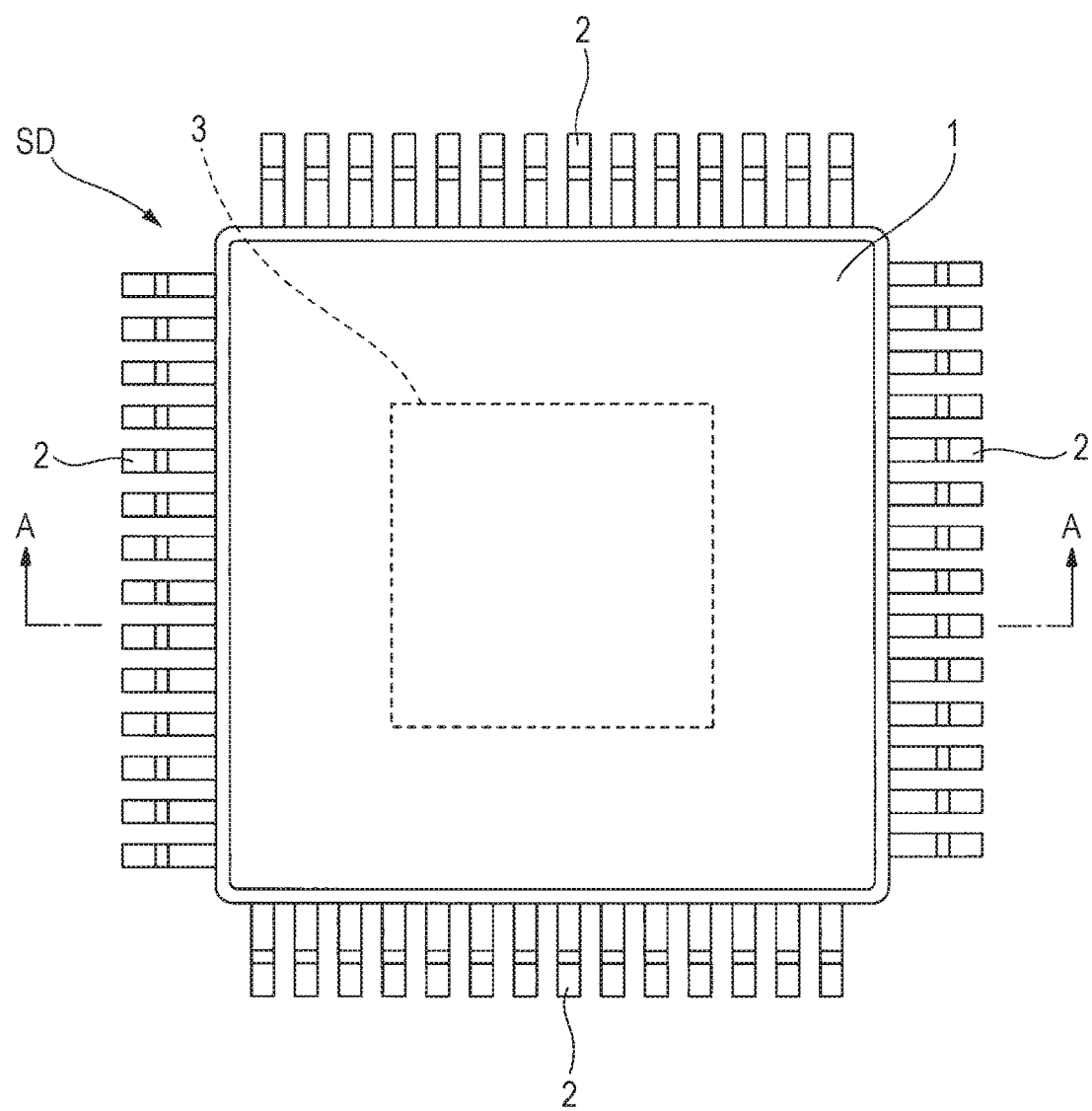
FIG. 1 is a plan view of a semiconductor device of the present embodiment.

In the below-described embodiments, a description will be made after divided into a plurality of sections or embodiments if necessary for the sake of convenience. These sections or embodiments are not independent from each other unless otherwise particularly specified, and one of them may be a modification example, details, a complementary description, or the like of a part or whole of the other one.

In the below-described embodiments, when a reference is made to the number (including the number, value, amount, range, or the like) of a component, the number is not limited to a specific number but may be more or less than the specific number, unless otherwise particularly specified or principally apparent that the number is limited to the specific number.

Further, in the below-described embodiments, it is needless to say that the constituent component (including component step or the like) is not always essential unless otherwise particularly specified or principally apparent that it is essential.

Similarly, in the below-described embodiments, when a reference is made to the shape, positional relationship, or the like of the constituent component, a component substantially approximate or analogous in shape or the like is also embraced unless otherwise particularly specified or principally apparent that it is not. This also applies to the above-described number or range.

In all the drawings for describing the embodiments, the same members will be identified by the same reference numeral or sign in principal and overlapping descriptions will be omitted. Even plan views may be hatched to facilitate understanding of them.

EMBODIMENT

Investigation Example

First, a semiconductor device investigated by the present inventors will be described.

In the semiconductor device of Investigation Example, a pad electrode comprised of an aluminum (Al) layer has thereon a conductive layer and a wire comprised of copper (Cu) is electrically connected with the pad electrode via this conductive layer. Interposing a conductive layer between a pad electrode and a wire is called an OPM (over pad metallization) process.

When a wire comprised of a copper having hardness higher than that of a wire comprised of gold (Au) is directly and thermally contact-bonded to a pad electrode comprised of aluminum and an ultrasonic wave is applied to a ball portion of the wire comprised of copper, a portion of the aluminum configuring the pad electrode is driven away to the periphery of a bonding portion between the ball portion of the wire and the pad electrode (which phenomenon is called "splash-out"). Occurrence of this splash-out is followed by contact (short circuit) of the portion of the aluminum configuring this pad electrode with another pad electrode positioned next thereto or cracks of a protecting film that covers a portion (here, a peripheral portion) of this pad electrode.

The present inventors therefore investigated use of nickel (Ni) having hardness higher than that of aluminum and gold (Au). Described specifically, the present inventors investigated a stacked structure in which a metal layer (nickel layer) made of nickel is covered with a metal layer (gold layer) made of gold. Improved connection reliability can be achieved between the wire and the conductive layer by forming the metal layer made of gold (Au) on the metal layer made of nickel.

The present inventors have found that when they tried to electrically connect the wire comprised of copper with the pad electrode made of aluminum, the bonding strength of the wire is lowered though the main surface (wire bonding surface) of the conductive layer is made of gold.

By the investigation by the present inventors, it has been revealed that application of heat (more specifically, "temperature×time") to the pad electrode prior to a step (wire bonding step) of electrically connecting the wire with the pad electrode causes deposition (transfer) of nickel (element), that configures the nickel layer positioned right below the gold layer, on (to) the surface (wire bonding surface and side surface) of this gold layer via the grain boundary (crystal grain boundary) of the gold configuring the gold layer formed to cover the nickel layer. It has also been revealed that during the wire bonding step, when the nickel deposited on the surface of the gold layer is present in a wire connecting region of the surface of the gold layer configuring the conductive layer, this nickel is interposed between the wire and the gold layer and deteriorates the bonding strength of the wire.

In order to prevent nickel deposition on the surface of the gold layer, it is necessary to interpose, for example, a metal layer (palladium layer) made of palladium between the nickel layer and the gold layer. Further investigation by the present inventors has however revealed that when a measure is taken to simply prevent nickel deposition on the surface of the gold layer, a sealing body made of a resin and formed in a resin sealing step performed after the wiring bonding step separates from the surface (particularly, the main surface to which the wire is bonded) of the conductive layer. This problem occurs because as described above, the main surface of the conductive layer is made of gold which is a noble metal. When separation (interfacial separation) of the sealing body from the surface (particularly, main surface) of the conductive layer occurs, the bonding portion between the wire and the conductive layer may be damaged due to the influence of the interfacial separation, even if the wire can be bonded to the main surface of the conductive layer in the previous wire bonding step.

An object of the present embodiment is therefore not only to improve the bonding strength between the wire comprised of copper and the conductive layer formed on the pad electrode but also to improve the adhesion between the conductive layer formed on the pad electrode and the resin (sealing body).

Next, the present embodiment will be described with a QFP (quad flat package) semiconductor device as an example. More specifically, an example using a leadframe as a base material on which a semiconductor chip 3 is to be mounted will be described.

<Semiconductor Device>

Figure 2:
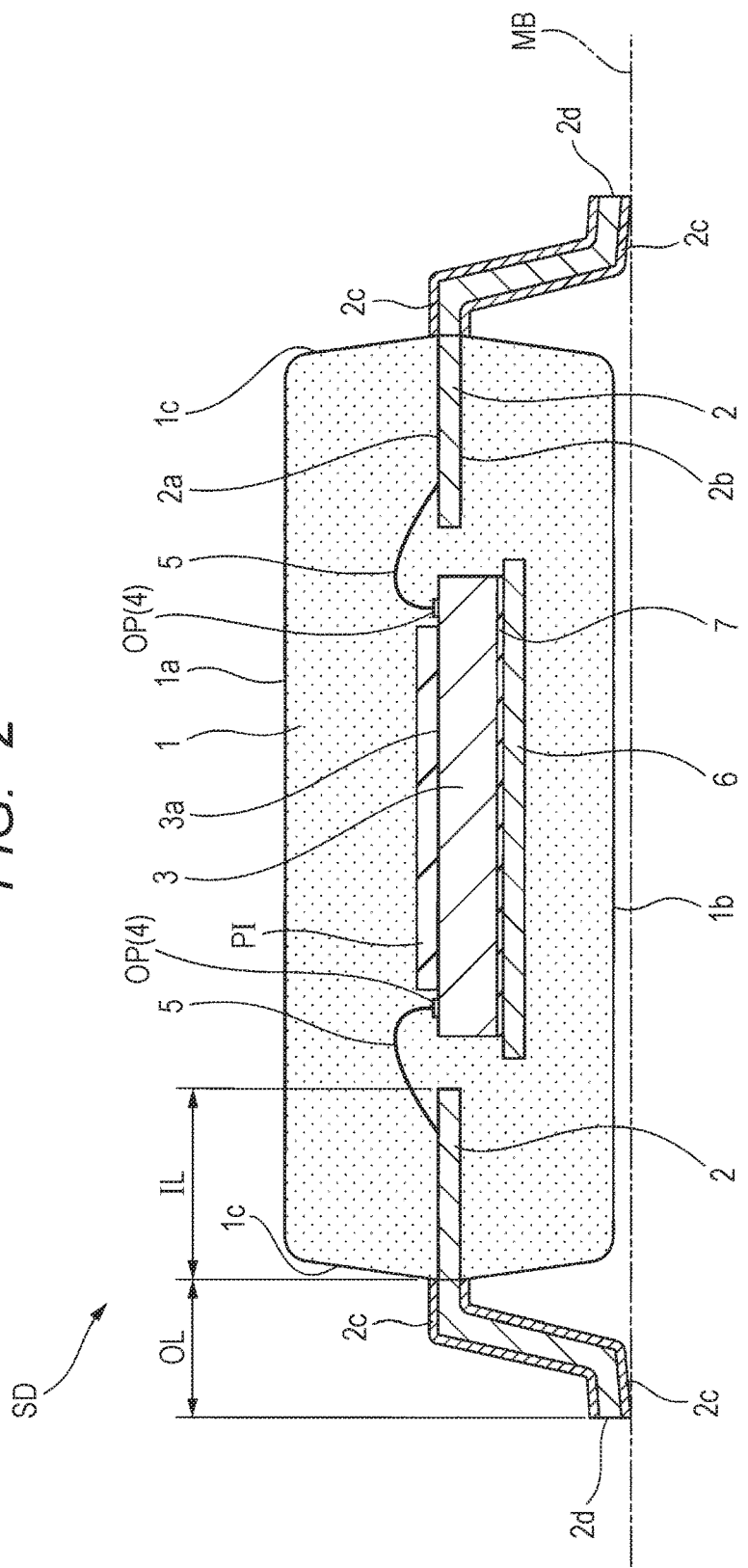
FIG. 2 is a cross-sectional view taken along the line A-A of FIG. 1.
Figure 3:
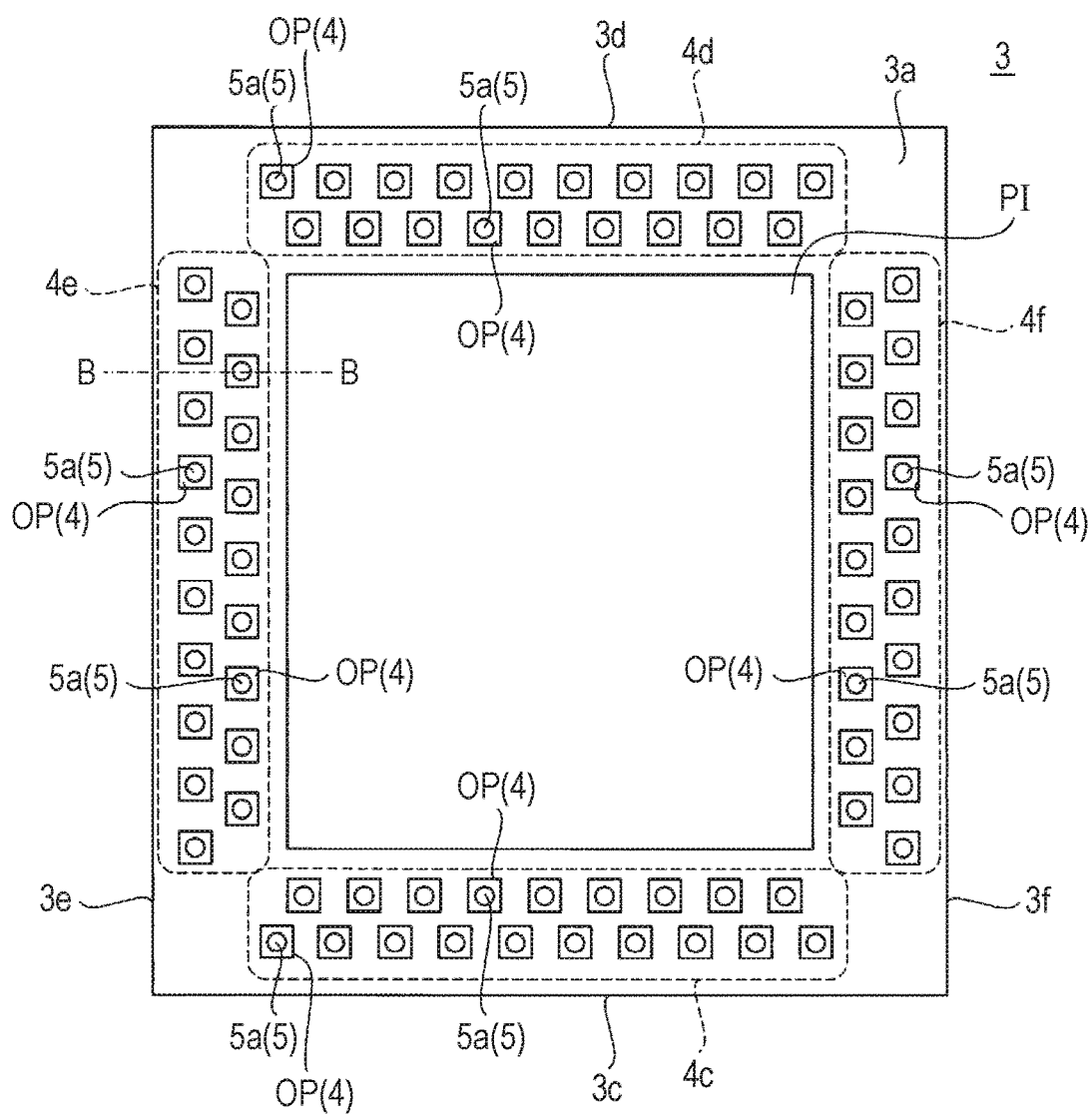
FIG. 3 is a plan view of a semiconductor chip of the present embodiment.
Figure 4:
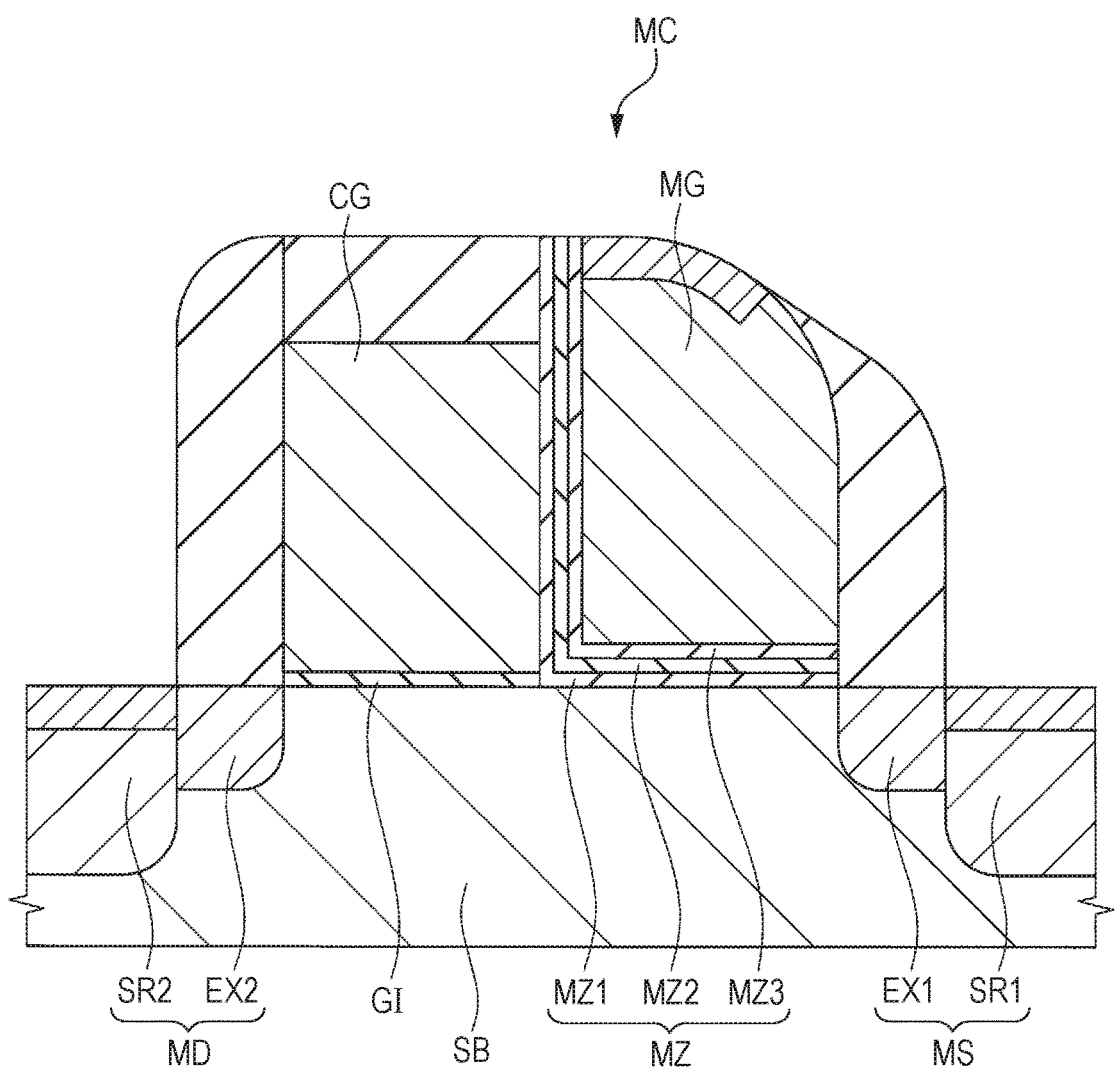
FIG. 4 is a cross-sectional view of a nonvolatile memory cell which is a semiconductor element of the present embodiment.
Figure 5:
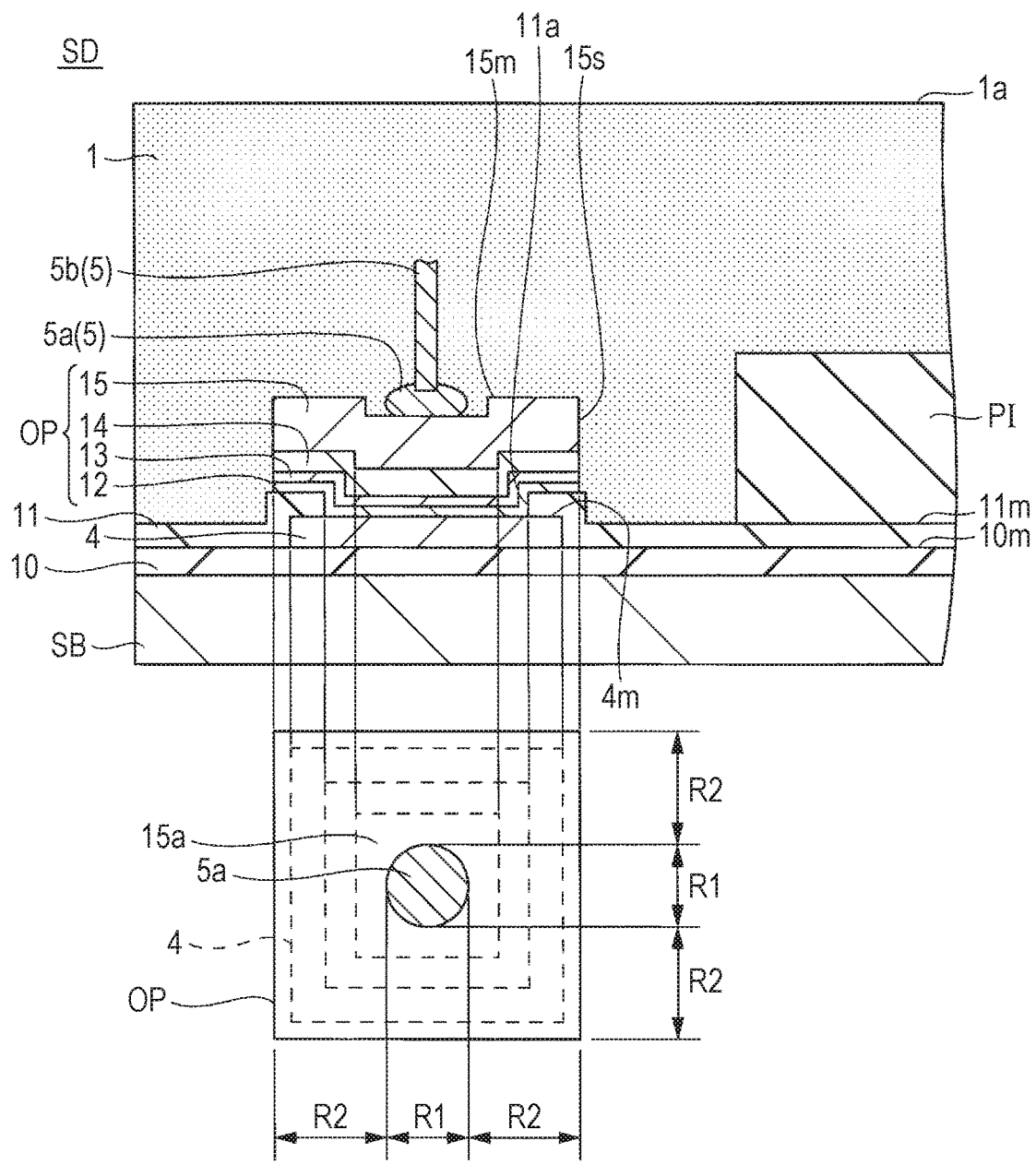
FIG. 5 is a fragmentary cross-sectional view taken along the line B-B of FIG. 3.
Figure 6:
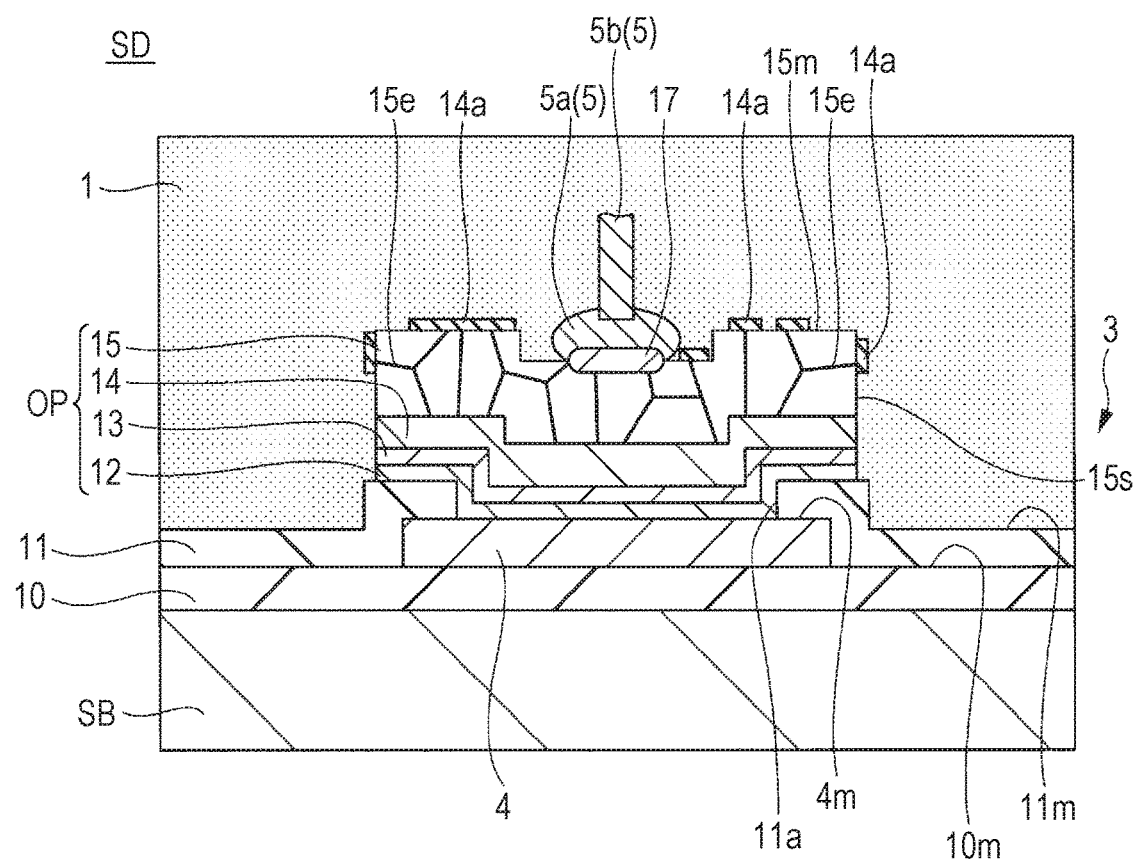
FIG. 6 is a fragmentary enlarged view of FIG. 5.

First, the configuration of a semiconductor device (semiconductor integrated circuit device) SD of the present embodiment will be described referring to FIGS. 1 to 6. FIG. 1 is a plan view of the semiconductor device of the present embodiment. FIG. 2 is a cross-sectional view taken along the line A-A of FIG. 1. FIG. 3 is a plan view of a semiconductor chip of the present embodiment. FIG. 4 is a cross-sectional view of a nonvolatile memory cell which is a semiconductor element of the present embodiment. FIG. 5 is a fragmentary cross-sectional view taken along the line B-B of FIG. 3. FIG. 6 is a fragmentary enlarged cross-sectional view of FIG. 5.

As shown in FIG. 1, the semiconductor device SD of the present embodiment has a substantially rectangular sealing body 1 and a plurality of leads 2. The sealing body has four sides and from each side, a plurality of leads 2 protrudes from the sealing body 1 such that they extend in a direction orthogonal to the side. The sealing body 1 has, at the center portion thereof, a semiconductor chip 3. This semiconductor device SD is a QFP (quad flat package) semiconductor device.

In FIG. 2, the two-dot chain line represents a mounting surface MB of a mounting substrate on which the semiconductor device SD is to be mounted. The semiconductor device SD has the semiconductor chip 3, a plurality of wires 5, the plurality of leads 2, and the sealing body 1.

The semiconductor chip 3 is comprised of, for example, a semiconductor substrate made of silicon (Si) and has a plurality of semiconductor elements, a plurality of wirings, a plurality of pad electrodes 4 (terminals, external electrodes, external lead electrodes, or electrode pads), and a conductive layer OP.

The semiconductor elements are connected by a plurality of wirings (metal wirings) and configure a circuit block. The circuit block (semiconductor elements) is electrically connected with the pad electrode 4 via a wiring. The pad electrode 4 is electrically connected with the lead 2 via the conductive layer OP and the wire 5. The pad electrode 4 is connected with the lead 2 comprised of, for example, copper (Cu) as a main component by a wire (bonding wire) 5 comprised of, for example, copper (Cu) as a main component via the conductive layer OP. More specifically, a portion (region) of the surface of the lead 2 with which the wire 5 is to be connected has thereon a plating film (metal film), though not illustrated. Via this plating film, the wire 5 is electrically connected with the lead 2. As shown in FIG. 5 which will be described later, the wire 5 has a ball portion 5a and a wire portion 5b. As is apparent from FIGS. 2 and 5, the wire portion 5b has, at one end thereof, the ball portion 5a. The ball portion 5a is connected with the pad electrode 4 via the conductive layer OP. The wire portion 5b is, at the other end thereof (stick portion), connected with the lead 2.

The term "is comprised of copper (Cu)" as used herein means "is a metal comprised of copper (Cu) as a main component". A metal film, lead, or wire comprised of copper (Cu) as a main component may be that containing a copper alloy containing a trace amount of a metal additive (1% or less). Examples of the metal additive include aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), In (indium), nickel (Ni), platinum (Pt), a lanthanoid metal, and an actinoid metal. These metals may be contained either singly or in combination. In the wire used in the present embodiment, the surface of the wire comprised of, for example, copper (Cu) may be covered with a metal (for example, palladium) different from copper.

The sealing body 1 comprised of, for example, an epoxy resin covers the semiconductor chip 3, a polyimide layer PI, the conductive layer OP, the wire 5, the plurality of leads 2, a die pad (chip mounting portion) 6, and an adhesive layer 7. The semiconductor chip 3 is caused to adhere to the die pad 6 with the adhesive layer 7. The sealing body 1 has, as shown in FIG. 2, a main surface (sealing body main surface) 1a, a back surface (sealing body back surface) 1b, and a side surface (sealing body side surface) 1c that connects between the main surface 1a and the back surface 1b. When the semiconductor device SD is mounted on a mounting substrate, the main surface (upper surface) 1a and the back surface (bottom surface) 1b are parallel to the mounting surface MB. The surface of the semiconductor device SD mounted on the mounting substrate which surface is close to the mounting surface MB is called "sealing body back surface (bottom surface) 1b and that distant from the mounting surface MB is called "sealing body main surface (upper surface) 1a.

The leads 2 each have a main surface (upper surface, lead main surface, or wire bonding surface) 2a and a back surface (bottom surface or lead back surface) 2b. The leads 2 are each comprised of an inner lead portion IL positioned inside the sealing body 1 and an outer lead portion OL connected with this inner lead portion 1L and positioned outside the sealing body 1. Although not illustrated in FIG. 1, the inner lead portion IL of each of the leads 2 is arranged around the semiconductor chip 3 and extends from the side surface 1c of the sealing body 1 to the semiconductor chip 3. The main surface 2a and the back surface 2b of the outer lead portion OL are covered with a solder plating film 2c. The side surface of the outer lead portion OL of the lead 2 (not the surface indicated by the reference numeral 2d in FIG. 2 but the surface facing to a lead 2 adjacent thereto in FIG. 1) is also covered with the solder plating film 2c, but the end 2d of the outer lead portion OL is not covered with the solder plating film 2c. Thus, there exists a portion where the base material is exposed. The base material of the end 2d is however covered, at the periphery thereof, with the solder plating film 2c. The wire 5 is connected with the main surface 2a of the inner lead portion IL of the lead 2.

The outer lead portion OL has a gull-wing shape and is comprised of a protruding portion which protrudes outside the sealing body 1 continuously and linearly from the inner lead portion IL, a bending portion which extends from the protruding portion toward the mounting surface MB, and a connection portion which extends from the bending portion substantially parallel to the mounting surface MB and is connected with the mounting substrate via a mounting solder.

As shown in FIG. 3, the semiconductor chip 3 having a rectangular shape in plan view has sides 3c and 3d which face to each other and sides 3e and 3f which face to each other. The semiconductor chip 3 has, on the main surface 3a thereof, pad electrode groups 4c to 4f which are assemblies of a plurality of pad electrodes 4 along the sides 3c to 3f, respectively. In the pad electrode group 4c, two rows of pad electrodes 4 are arranged along the side 3c. The pad electrodes 4 each have thereon the conductive layer OP and with the conductive layer OP, the ball portion 5a of the wire 5 is connected. The pad electrode groups 4d, 4e, and 4f also have a similar configuration. In a region surrounded with the four pad electrode groups 4c to 4f, the semiconductor chip 3 has, on the main surface 3a thereof, a polyimide layer (organic insulating film) PI having a rectangular shape in plan view. The polyimide layer PI is formed in a region surrounded with the pad electrode groups 4c to 4f. The polyimide layer exists neither at the corner of the semiconductor chip 3 (for example, in a region between the pad electrode group 4c and the pad electrode group 4e or 4f or in a region between the pad electrode group 4d and the pad electrode group 4e or 4f) nor in a region between the pad electrode groups 4c to 4f and the sides 3c to 3f, respectively. Further, no polyimide layer PI is formed in a region between the pad electrodes 4 in each of the pad electrode groups 4c to 4f. In other words, as shown in FIG. 5, in a region between the polyimide layer PI and the sides 3c to 3f and not having the pad electrode 4 (and the conductive layer OP) therein, the sealing body 1 is in contact with an insulating layer 11.

The semiconductor element includes, for example, MIS-FET (metal insulator semiconductor field effect transistor) and a nonvolatile memory cell and is, for example, in a region of the semiconductor substrate SB (refer to FIG. 5) covered with the polyimide layer PI of FIG. 3.

As shown in FIG. 4, the nonvolatile memory cell MC has a control gate electrode CG, a memory gate electrode MG, a drain region MD, and a source region MS. The control gate electrode CG exists on the main surface (element formation surface) of the semiconductor substrate SB via a gate insulating film GI, while the memory gate electrode MG exists on the main surface (element formation surface) of the semiconductor substrate SB via a memory insulating film MZ. The drain region MD and the source region MS formed in the semiconductor substrate SB so as to sandwich the control gate electrode CG and the memory gate electrode MG therebetween are comprised of a semiconductor region EX2 and a semiconductor region SR2 and a semiconductor region EX1 and a semiconductor region SR1, respectively. Further, the memory insulating film MZ has a three layer stacked structure in which, for example, an insulating film MZ2 comprised of a silicon nitride film is sandwiched between insulating films MZ1 and MZ3 comprised of a silicon oxide film. The insulating film MZ2 is a data holding layer and the data "1" or "0" of the nonvolatile memory cell MC is determined by whether the insulating film MZ2 holds a charge or not.

FIG. 5 is a cross-sectional view taken along the line B-B of FIG. 3. It also includes a plan view of the pad electrode 4 and the conductive layer OP. FIG. 6 is a fragmentary enlarged view of FIG. 5. Particularly, it shows the details of the conductive layer 15.

As shown in FIG. 5, the semiconductor substrate SB has, on the main surface (element formation surface) thereof, the pad electrode 4 via an insulating layer 10. As described in FIG. 4, the semiconductor substrate SB has, on the main surface (element formation surface) thereof, a number of nonvolatile memory cells MC and has thereabove a plurality of wiring layers and a plurality of insulating layers formed (arranged) alternately. The wiring layers each include a plurality of wirings. The pad electrode 4 is made of a portion of a wiring formed in the uppermost one of the plurality of wiring layers. Wirings formed in the wiring layer other than the uppermost one of the plurality of wiring layers are each made of, for example, a metal film comprised of copper (Cu) as a main component. Among the plurality of insulating layers, an insulating layer (interlayer insulating film) positioned between this wiring layer comprised of copper and a wiring layer different therefrom but similarly comprised of copper uses an insulating film having a specific dielectric constant of 3.0 or less, so-called Low-k film. Among the plurality of insulating layers, on the other hand, the insulating layer 10 positioned right below the pad electrode 4 uses an insulating film having a specific dielectric constant higher than that of the interlayer insulating film, for example, an inorganic insulating film such as silicon oxide film. FIG. 5 does not illustrate a plurality of wiring layers and interlayer insulating films.

The semiconductor substrate SB has, on the main surface thereof, the pad electrode 4 via the insulating layer 10. The pad electrode 4 is made of an aluminum film, but it may have a stacked structure having, under the aluminum film, a titanium/titanium nitride film stack or the like and having, on the aluminum film, a titanium nitride film. The aluminum film may contain a trace amount (for example, 2 wt % or less) of copper or the like.

The main surface (upper surface) 10m of the insulating layer 10 and the pad electrode 4 are covered with an insulating layer 11 functioning as a protection film and the main surface (upper surface) 11m of the insulating film 11 has a step difference portion corresponding to the thickness of the pad electrode 4. This step difference portion is present in the vicinity of the pad electrode 4 and at the same time, outside the pad electrode 4 and the conductive layer OP. In other words, the step difference portion is apart from the pad electrode 4 by a distance equal to the thickness of the insulating film 11. In addition, the insulating layer 11 has therein an opening (opening portion) 11a exposing therefrom a portion (surface to which the conductive layer is brought into contact) of the main surface (upper surface) 4m of the pad electrode 4. The insulating layer 11 is made of a silicon nitride film or a film stack obtained by stacking a silicon nitride film on a silicon oxide film. This means that similar to the insulating layer 10, the insulating layer 11 is made of an inorganic insulating film.

The pad electrode 4 has thereon the conductive layer OP and the wire 5 is electrically connected with the pad electrode 4 via this conductive layer OP. This conductive layer OP is in contact with the pad electrode 4 in the opening 11a formed in the insulating layer 11 and it further extends onto the main surface (upper surface) 11m of the insulating layer 11 formed on the peripheral portion of the pad electrode 4. When the aluminum film configuring the pad electrode 4 has thereon a titanium nitride film, the titanium film having a resistance higher than that of the aluminum film is removed in the opening 11a and the main surface of the aluminum film is exposed. This means that the conductive layer OP is in contact with the aluminum film, not intermediated by the titanium nitride film.

The conductive layer OP is comprised of four layers, that is, conductive layers 12, 13, 14, and 15 in order from the bottom layer as shown in FIG. 5. In the present embodiment, the conductive layers 12, 13, 14, and 15 are comprised of chromium (Cr), copper (Cu), nickel (Ni), and gold (Au), respectively. The conductive layer 15 is a layer for suppressing oxidation of a metal layer (nickel layer) comprised of nickel and it is also a bonding layer for the formation of an alloy layer with the wire 5. The conductive layer 14 is a stress relax layer for preventing the pad electrode 4 from being deformed by the stress during wire bonding. The conductive layer 13 is a layer serving as a power supply layer when the conductive layers 14 and 15 are formed by electroplating. The conductive layer 12 is a reaction preventing layer between the pad electrode 4 and the conductive layer 13. As a material configuring the conductive layer 12, titanium (Ti) as well as chromium can be used. As a material configuring the conductive layer 13, palladium (Pd) as well as copper can be used. The present embodiment describes use of electroplating for the formation of the conductive layer (nickel layer) 14 and the conductive layer (gold layer) 15 but they may be formed using electroless plating. In this case, formation of the conductive layer (copper layer) 13 used as a power supply layer and the conductive layer (chromium layer) 12 may be omitted. When electroplating is used, however, crystal grains configuring a film (that is, metal layer) formed by this electroplating can easily be made greater than crystal grains configuring a film (that is, metal layer) formed by electroless plating. In other words, a film formed by electroplating has a quality better than that of a film formed by electroless plating.

The conductive layer 12, 13, 14, and 15 have a substantially equal rectangular shape in plan view and and they overlap each other at the same position. FIG. 5 shows an example of the conductive layer OP greater than the pad electrode 4, but the conductive layer OP may be equal in size to the pad electrode 4 or may be smaller than the pad electrode 4. The pad electrode 4 and the conductive layer OP are preferably larger than the opening (opening portion) 11a formed in the insulating layer 11.

Next, the reference numeral R1 shown in FIG. 5 represents a region (wire bonding region) which is of the main surface (upper surface, wire bonding surface) 15m of the conductive layer (gold layer) 15 and into which the ball portion 5a of the wire 5 is brought into contact and the reference numeral R2 shown in FIG. 5 represents a region (sealing body bonding region) which is of the main surface 15m of the conductive layer (gold layer) 15 and into which the sealing body 1 is brought into contact. In short, the region R1 is a center portion of the conductive layer 15 in plan view and the region R2 continuously surrounds the region R1. The conductive layer (gold layer) 15 has, at the center of the main surface (upper surface) 15m thereof, a recess 15a. This means that the main surface 15m of the conductive layer 15 is comprised of the surface (surface to which the wire is bonded) of this recess 15a and a surface positioned around this recess 15a and positioned closer to the main surface 1a of the sealing body 1 than to the surface of this recess 15a. The ball portion 5a of the wire 5 is present, for example, inside this recess 15a (refer to the plan view of FIG. 5). The conductive layer 15 made of a gold layer may however stride over the recess 15a and a projection therearound because the conductive layer has low hardness. Since the conductive layer (nickel layer 14) has hardness higher than that of the conductive layer (gold layer) 15, the ball portion 5a is preferably positioned inside the recess of the conductive layer 14.

As shown in FIG. 5, the polyimide layer PI is present on the insulating layer 11 while being in contact with the main surface (upper surface) 11m of the insulating layer 11 and the polyimide layer PI, the conductive layer OP, the wire 5, and the insulating layer 11 are covered with the sealing body 1. The sealing body 1 is made of, for example, an epoxy resin. The sealing body 1 contains, for example, a silane coupling agent.

Next, the conductive layer OP described referring to FIG. 5 and a bonding portion between the conductive layer OP and the wire 5 will be described in detail referring to the fragmentary enlarged view of FIG. 6.

As shown in FIG. 6, the conductive layer 15 and the ball portion 5a of the wire 5 have therebetween an alloy layer 17 comprised of gold (Au) configuring the conductive layer (gold layer) 15 and copper (Cu) configuring the wire 5. This means that the region R1 in FIG. 5 has therein the alloy layer 17 shown in FIG. 6. The conductive layer 15 has, on the main surface 15m and the side surface 15s thereof, a metal oxide layer 14a comprised of nickel diffused from the conductive layer 14 via the grain boundary 15e of the gold layer. This means that the metal oxide layer 14a is a nickel oxide layer (NiO). Although described in detail later, since this metal oxide layer 14a is in contact with the sealing body 1 containing a silane coupling agent, an adhesive force between the conductive layer 15 and the sealing body 1 becomes better than that without the metal oxide layer 14a, making it possible to prevent separation between them. In other words, this metal oxide layer 14a present in the region R2 that continuously surrounds the region R1 can prevent separation of the sealing body 1 from the main surface 15m and the side surface 15s of the conductive layer 15. For example, when the side surface 15s has no metal oxide layer 14a thereon, separation occurs on the side surface 15s of the conductive layer 15 and this separation extends to the main surface 15m. As a result, there may be a risk of damage at the bonding portion between the wire 5 and the conductive layer 15. In the present embodiment, however, since the adhesion between the conductive layer 15 and the sealing body 1 at the main surface 15m and the side surface 15s of the conductive layer 15 can be improved, damage at the bonding portion between the wire 5 and the conductive layer 15 can be prevented. In other words, the conductive layer OP and the sealing body 1 can have improved adhesion and separation of the wire 5 from the conductive layer OP can be prevented. Since the region R1 has therein no metal oxide layer 14a, the wire 5 and the conductive layer OP can be bonded with improved strength.

<Method of Manufacturing Semiconductor Device>

Figure 7:
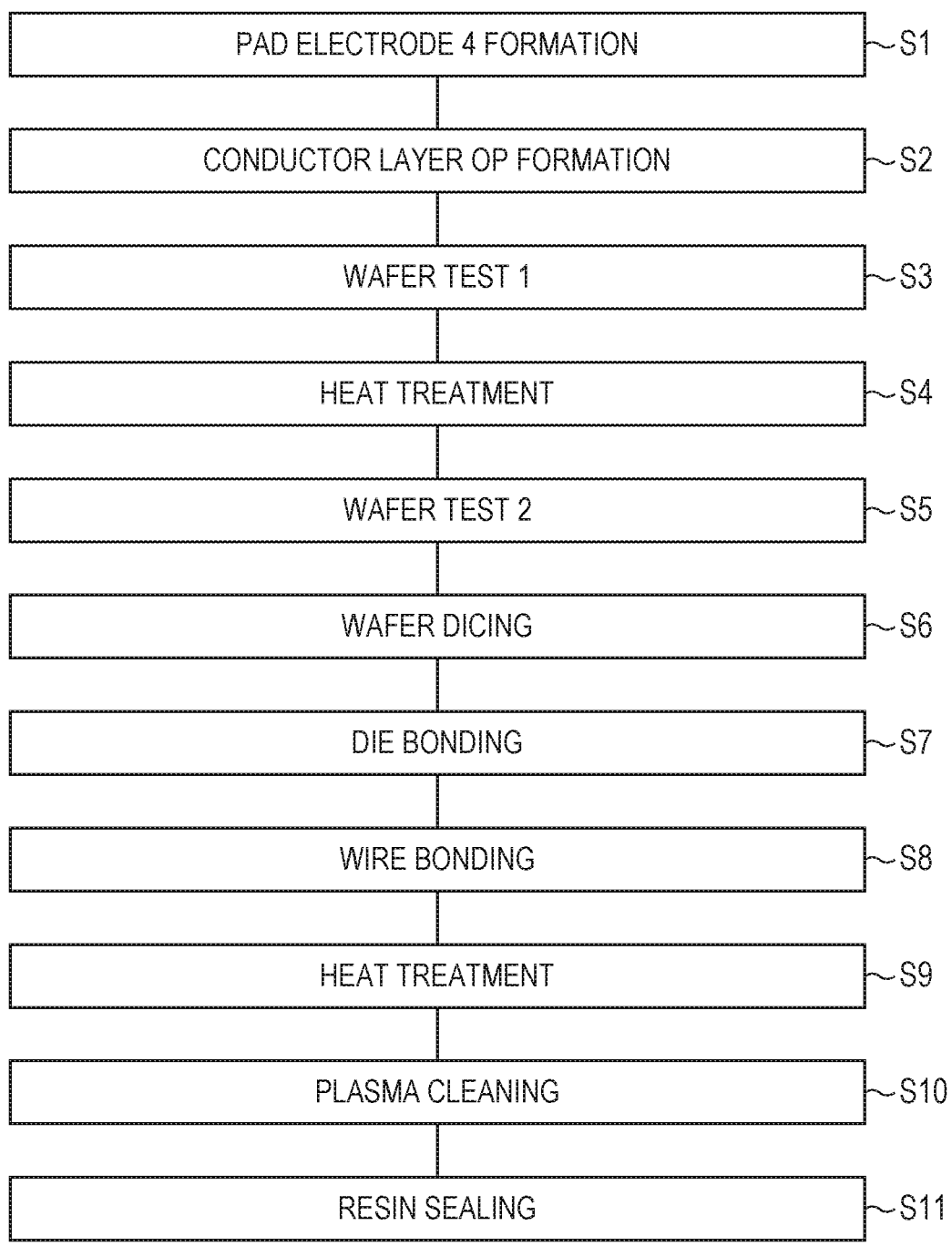
FIG. 7 is a process flow chart showing manufacturing steps of the semiconductor device of the present embodiment.
Figure 8:
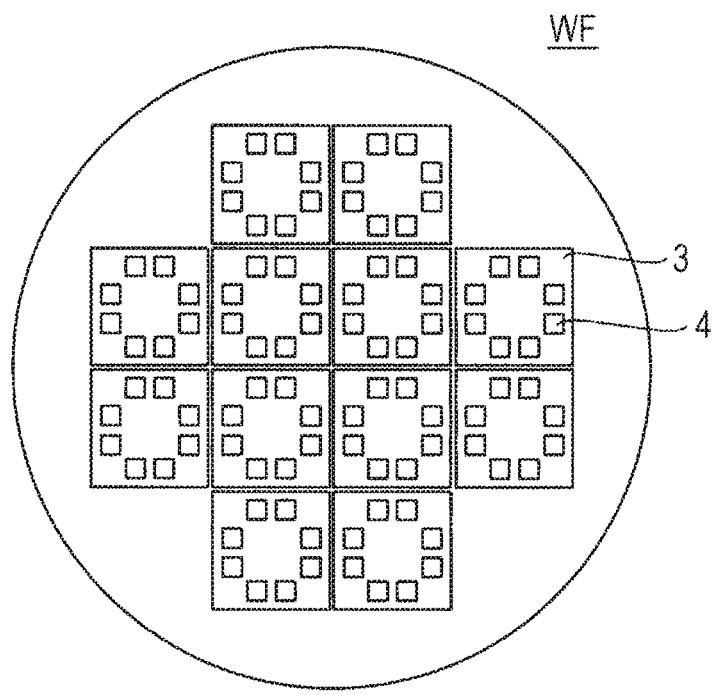
FIG. 8 is a plan view of the semiconductor device of the present embodiment during a manufacturing step thereof.
Figure 9:
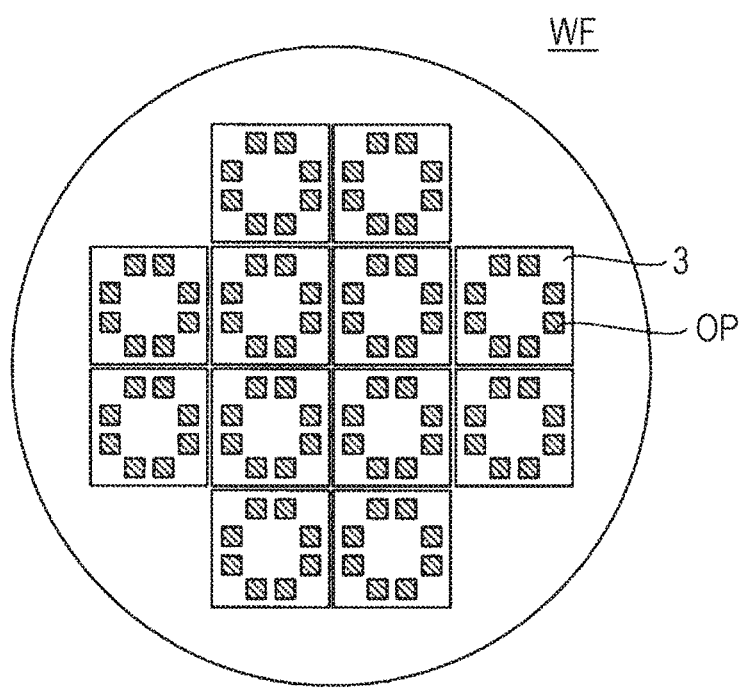
FIG. 9 is a plan view of the semiconductor device during a manufacturing step thereof following that of FIG. 8.
Figure 13:
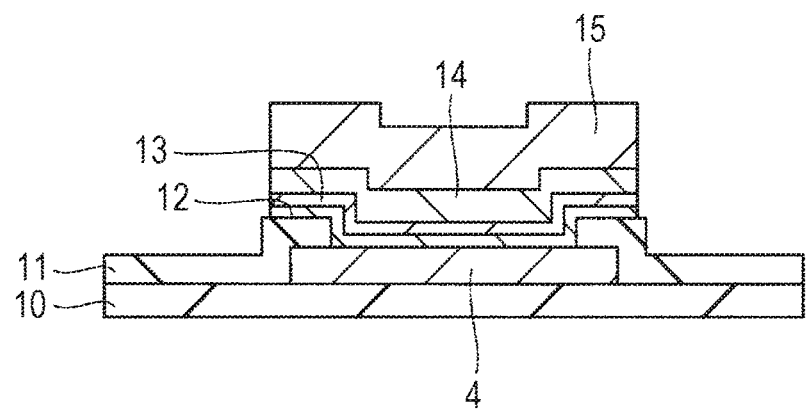
FIG. 13 is a cross-sectional view of the conductive layer OP during a manufacturing step thereof following that of FIG. 12.
Figure 14:
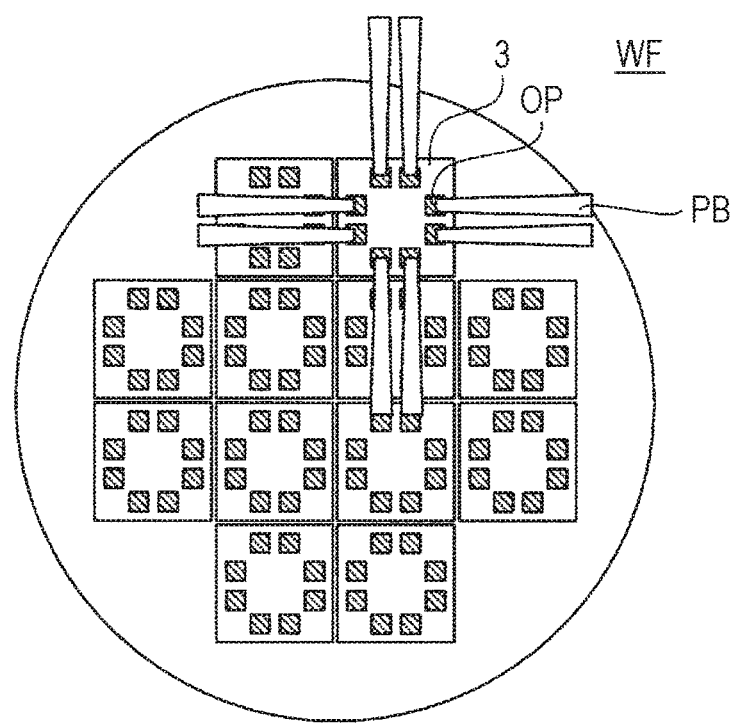
FIG. 14 is a plan view of the semiconductor device during a manufacturing step thereof following that of FIG. 9.
Figure 15:
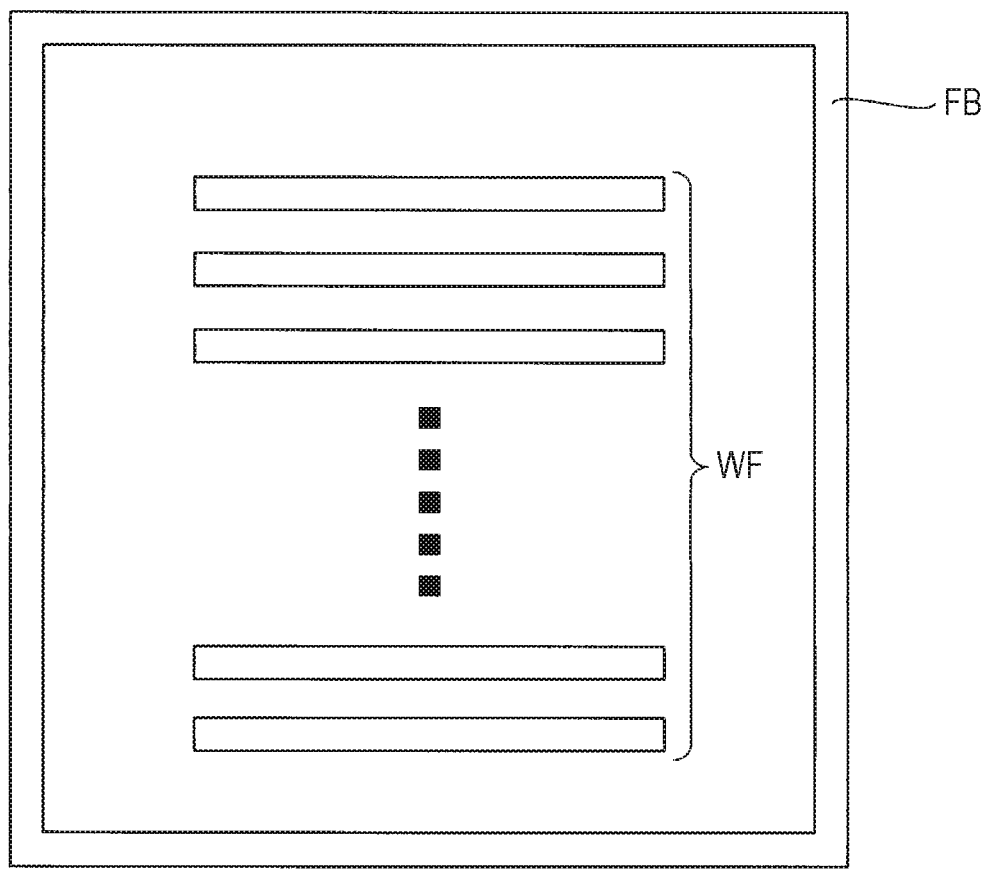
FIG. 15 is a cross-sectional view of the semiconductor device during a manufacturing step thereof following that of FIG. 14.
Figure 16:
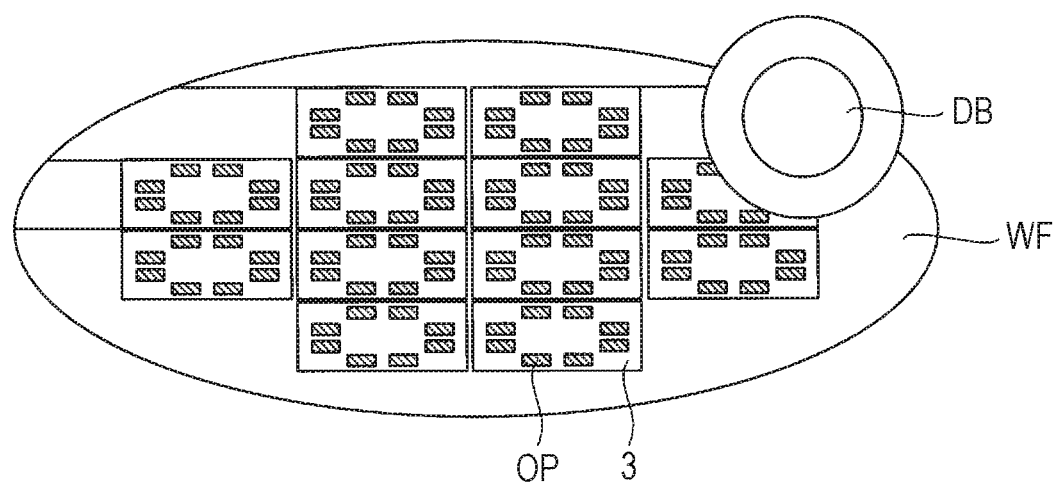
FIG. 16 is a perspective view of the semiconductor device during a manufacturing step thereof following that of FIG. 15.
Figure 22:
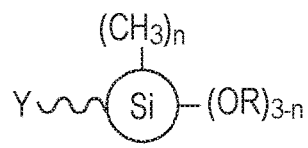
FIG. 22 shows a chemical structure of a silane coupling agent contained in the sealing resin of the present embodiment.
Figure 23:
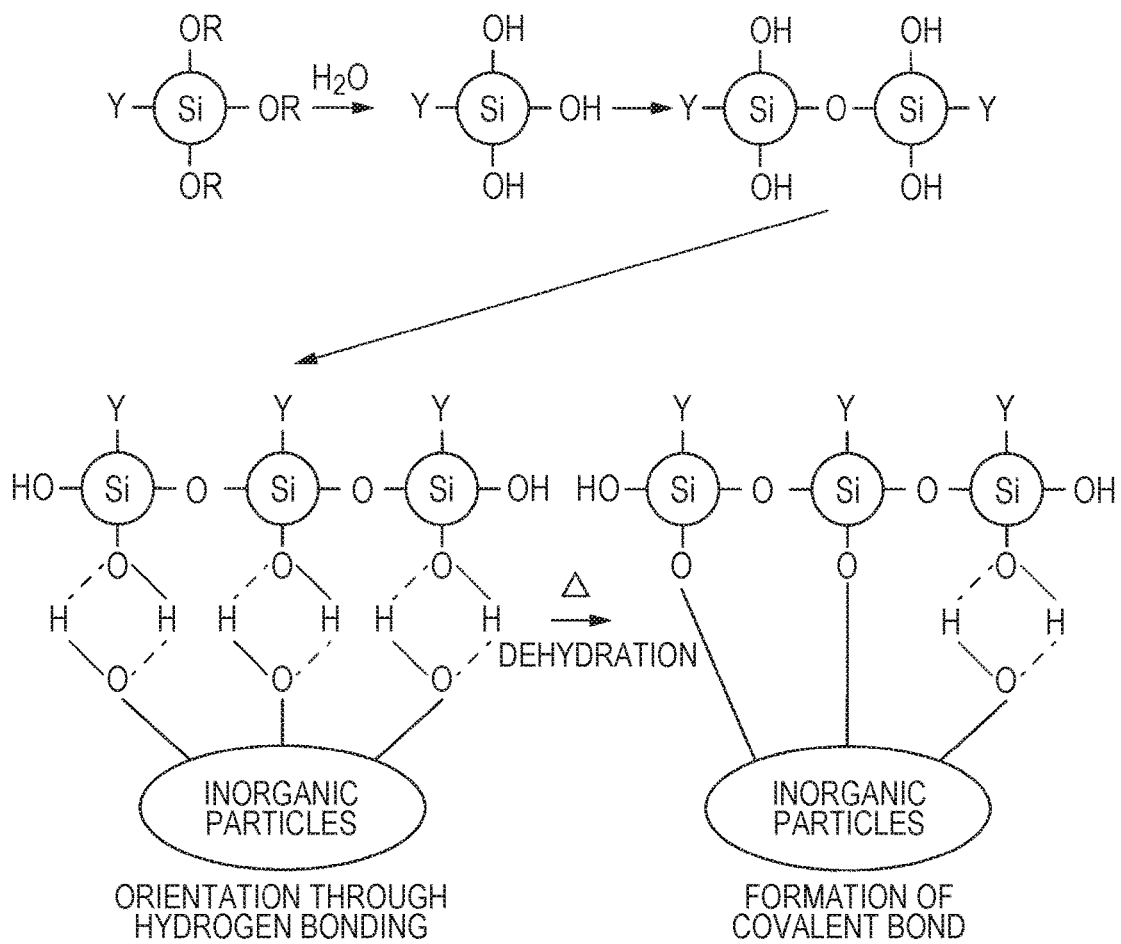
FIG. 23 shows a reaction mechanism between the silane coupling agent and a nickel oxide layer in the present embodiment.

A method of manufacturing a semiconductor device SD of the present embodiment will next be described referring to FIGS. 7 to 24. FIG. 7 is a process flow chart showing manufacturing steps of the semiconductor device of the present embodiment. FIGS. 8, 9, and 14 are plan views of the semiconductor device of the present embodiment during manufacturing steps thereof, respectively. FIGS. 10 to 13 are cross-sectional views of a conductive layer OP during manufacturing steps thereof shown in FIG. 9, respectively. FIGS. 15 and 17 to 21 are plan views of the semiconductor device of the present embodiment during manufacturing steps thereof, respectively. FIG. 16 is a perspective view of the semiconductor device of the present embodiment during a manufacturing step thereof. FIG. 22 shows a chemical structure of a silane coupling agent contained in the sealing resin of the present embodiment. FIG. 23 shows a reaction mechanism between the silane coupling agent and a nickel oxide layer in the present embodiment. FIG. 24 is a table showing the relation between the thickness of a gold film and baking conditions in the present embodiment.

First, a pad electrode 4 formation step (S1) shown in FIG. 7 is performed.

As shown in FIG. 8, a semiconductor wafer WF having a plurality of semiconductor chips 3 arranged in matrix form is provided. The semiconductor chips 3 each have therein a plurality of pad electrodes 4. FIGS. 8, 9, and 14 are simplified views of the semiconductor chips 3. The number of, for example, the pad electrodes 4 or the conductive layers OP is therefore different from that shown in FIG. 3.

Next, a conductive layer OP formation step (S2) shown in FIG. 7 is performed.

As shown in FIG. 9, a conductive layer OP is formed on the pad electrode 4 of each of the semiconductor chips 3. A method of forming the conductive layer OP will be described referring to FIGS. 10 to 13.

Figure 10:
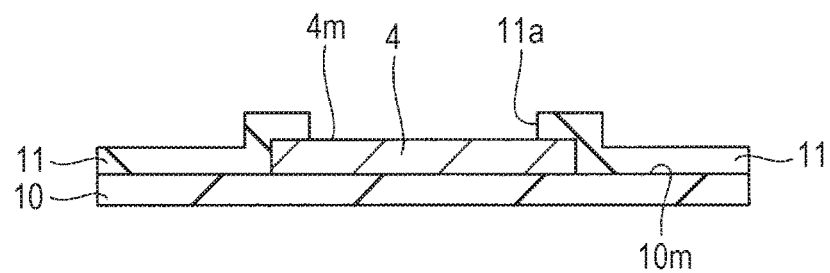
FIG. 10 is a cross-sectional view of a conductive layer OP shown in FIG. 9 during a manufacturing step thereof.

As shown in FIG. 10, an insulating layer 11 is formed, which covers the main surface (upper surface) 10m of the insulating layer 10 and the peripheral portion of the pad electrode 4 and has an opening (opening portion) 11a that exposes a portion of the main surface (upper surface) 4m of the pad electrode 4. As described above, in the present embodiment, the insulating layer 10 and the insulating layer 11 are each comprised of an inorganic insulating film.

Figure 11:
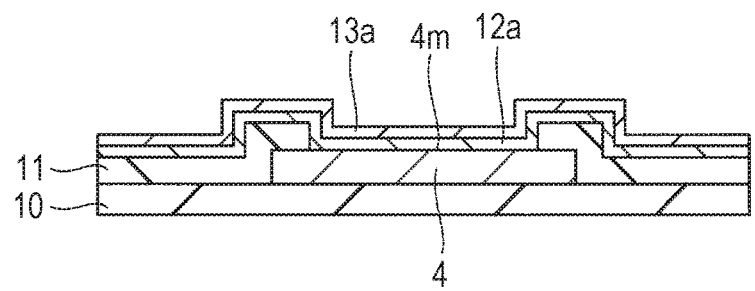
FIG. 11 is a cross-sectional view of the conductive layer OP during a manufacturing step thereof following that of FIG. 10.

Next, as shown in FIG. 11, a conductive layer (metal layer or chromium layer) 12a comprised of chromium (Cr) is formed so as to bring it into contact with a portion (exposed portion or exposed surface) of the main surface 4m of the pad electrode 4 exposed from the insulating layer 11 and on this conductive layer 12a, a conductive layer (metal layer or copper layer) 13a comprised of copper (Cu) is formed. In the present embodiment, the conductive layers 12a and 13a are each formed using, for example, sputtering.

Figure 12:
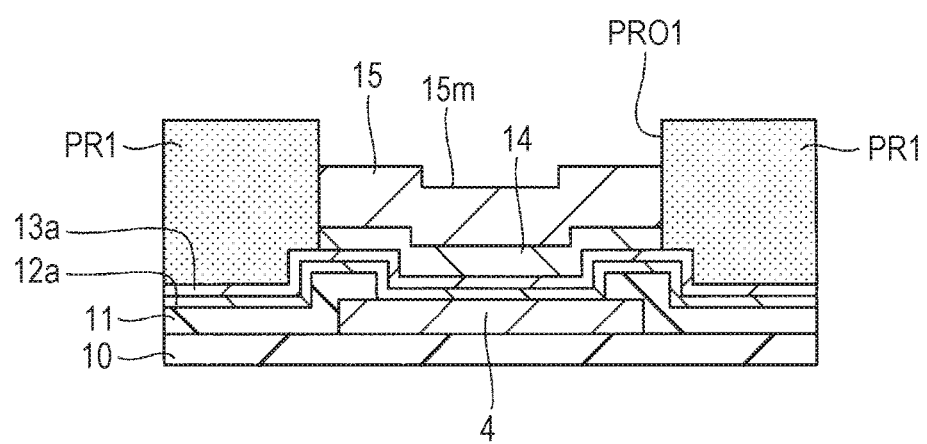
FIG. 12 is a cross-sectional view of the conductive layer OP during a manufacturing step thereof following that of FIG. 11.

Next, as shown in FIG. 12, a photoresist layer PR1 having an opening PRO1 corresponding to the above-described conductive layer OP comprised of four conductive layers (metal layers) 12, 13, 14, and 15 is formed on the conductive layer 13a. Next, a conductive layer (metal layer, nickel layer) 14 made of nickel and a conductive layer (metal layer or gold layer) 14 made of gold are selectively formed in the opening PRO1 by electroplating. The conductive layer (nickel layer) 14 has a thickness of, for example, from 1.5 to 2.0 μm and the conductive layer (gold layer) 15 has a thickness of 1.5 μm or more, preferably 1.5 μm or more and less than 2.0 μm. The conductive layer (nickel layer) 14 is thick enough to relax the impact given to the pad electrode 4 during a wire bonding step described later. The conductive layer (gold layer) 15 is thick enough to prevent, even after a heat treatment step (S4) of FIG. 7 described later, nickel from the conductive layer (nickel layer) 14 from causing grain boundary diffusion in the conductive layer (gold layer) 15 and being exposed from the main surface (surface on the side opposite to the surface facing to the conductive layer 14 or the surface to which the wire 5 is bonded) 15m of the conductive layer (gold layer) 15 in the wire bonding step (S8).

Next, after removal of the above-described photoresist layer PR1, the conductive layer 12a and the conductive layer 13a in a region exposed from the conductive layer 14 and the conductive layer 15 are removed. In the present embodiment, respective portions of the conductive layer 12a and the conductive layer 13a not overlapping with the conductive layer 14 and the conductive layer 15 are removed, for example, by wet etching. In such a manner, as shown in FIG. 13, a conductive layer OP (refer to FIG. 5) having a stacked structure comprised of the four conductive layers 12, 13, 14, and 15 is formed. In the present embodiment, described is a case where the four conductive layers 12, 13, 14, and 15 have the same rectangular shape (external size) each other as shown in FIG. 13, in other words, a case where the conductive layers 12, 13, 14, and 15 configure one side surface. The side surfaces of the conductive layer 12 and the conductive layer 13 may be present inside of the side surface of the conductive layer 15, which depends on the conditions (ex. time) of the above-described wet etching step.

Next, a wafer test 1 step (S3) shown in FIG. 7 is performed.

The semiconductor chip 3 of the present embodiment has therein a nonvolatile memory cell MC shown in FIG. 4. Circuit operations of this nonvolatile memory cell MC such as programming, erasing, and reading are performed and a threshold value at the time of erasing (or programming) of the nonvolatile memory cell MC is measured. This wafer test 1 step is performed by bringing a probe needle PB into contact with the conductive layer OP of the semiconductor chip 3 as shown in FIG. 14.

Next, a heat treatment step (S4) shown in FIG. 7 is performed.

The heat treatment step of the present embodiment is performed, for example, under the conditions of 250° C. and 16 hours. This heat treatment step is peculiar to a semiconductor wafer having a nonvolatile memory cell therein and it is called, for example, retention bake. As shown in FIG. 15, a plurality of semiconductor wafers WF housed in a furnace body FB is heat treated. This heat treatment causes accelerated screening, by which a data retention failure due to the defects of the memory insulating film MZ shown in FIG. 4 can be prevented. The term "data retention" as used herein means a time until the data stored in the memory insulating film MZ of the nonvolatile memory cell are lost.

As the investigation by the present inventors has revealed as described above, diffusion (grain boundary diffusion) of nickel configuring the conductive layer (nickel layer) 14 occurs in the conductive layer (gold layer) 15 that covers the conductive layer 14 due to the influence of heat, for example, in the retention baking step as described above. In the present embodiment, on the other hand, since the conductive layer (gold layer) 15 has a thickness equal to or greater than that of the conductive layer (nickel layer) 14, no nickel is deposited on the surface (in particular, the wire bonding surface having a surface area greater than that of the side surface) of the conductive layer (gold layer) 15 at the stage of finishing the retention baking step.

Next, a wafer test 2 step (S5) shown in FIG. 7 is performed.

As shown in FIG. 14, presence or absence of a data retention failure is detected by bringing the probe needle PB into contact with the conductive layer OP of the semiconductor chip 3 and measuring the threshold value at the time of erasing (or programming) of the nonvolatile memory cell MC again.

Next, a wafer dicing step (S6) shown in FIG. 7 is performed.

As shown in FIG. 16, the semiconductor wafer WF is divided into a plurality of semiconductor chips 3 with a dicing blade DB.

Next, a die bonding step (S7) shown in FIG. 7 is performed.

Figure 17:
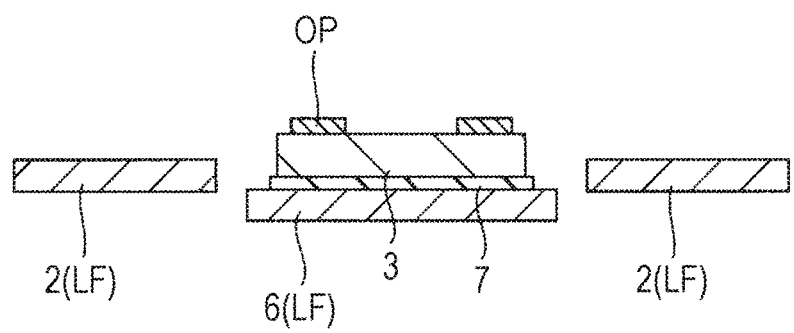
FIG. 17 is a cross-sectional view of the semiconductor device during a manufacturing step thereof following that of FIG. 16.

As shown in FIG. 17, an individual semiconductor chip 3 is caused to adhere onto a die pad 6 of a leadframe LF via an adhesive layer 7. The die bonding step is accompanied, for example, by heat treatment at 175° C. for about one hour. The heat load of this step is much smaller than that of the above-described heat treatment step (S4) and a heat treatment step (S9) described later and does not affect the grain boundary diffusion of nickel described later. Although not illustrated here, the leadframe LF has a plurality of semiconductor device formation regions and it has thereon a plurality of die pads 6.

Next, a wire bonding step (S8) shown in FIG. 7 is performed.

Figure 18:
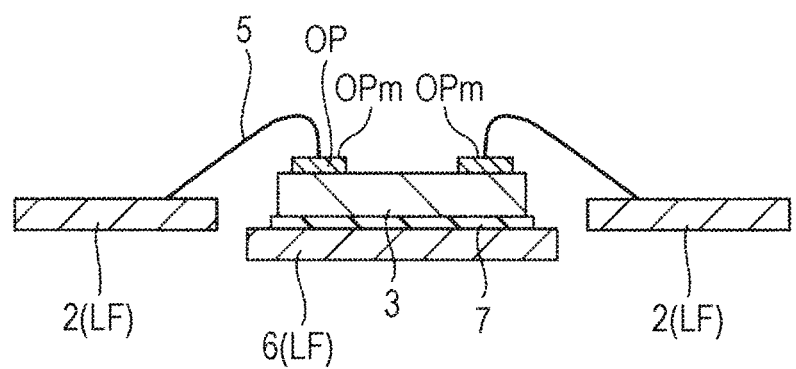
FIG. 18 is a cross-sectional view of the semiconductor device during a manufacturing step thereof following that of FIG. 17.

As shown in FIG. 18, the pad electrode 4 formed on the main surface of the semiconductor chip 3 is electrically connected with the lead 2 via the wire 5 and the conductive layer OP formed on this pad electrode 4. The wire 5 of the present embodiment is, for example, a wire comprised of copper (Cu) as a main component and this wire 5 is connected with the conductive layer OP by ball bonding (also called nail head bonding) which is a method using thermocompression bonding and ultrasonic vibration in combination. This step will next be described in detail. First, a portion of the wire 5 (here, it means the ball portion 5a shown in FIG. 5) is brought into contact with the main surface (upper surface or wire bonding surface) OPm of the conductive layer OP. A load and ultrasonic wave are each applied to the portion of the wire 5 to form an alloy layer 17 (refer to FIG. 6) comprised of a material (here, copper) configuring the wire 5 and a material (here, gold) configuring the conductive layer (gold layer) 15 positioned as the uppermost layer of the conductive layer OP on main surface (upper surface or wire bonding surface) OPm of the conductive layer OP with which the portion of the wire 5 is brought into contact. In the present embodiment, the alloy layer 17 formed between the ball portion 5a of the wire 5 and the conductive layer (gold layer) 15 has a thickness of, for example, about several nm.

It is important that, in the wire bonding step, nickel from the underlying conductive layer (nickel layer) 14 has not been deposited on the surfaces 15m and 15s (in particular, the main surface 15m) of the conductive layer (gold layer) 15 which is the uppermost layer of the conductive layer OP shown in FIG. 5. Since in the present embodiment, the conductive layer (gold layer) 15 has the thickness as described above and in the wire bonding step, the conductive layer (gold layer) 15 has, on the surface thereof (particularly, in the region R1 with which the wire is connected), no nickel oxide layer, an impurity-free alloy layer 17 can be formed. In other words, the wire 5 and the conductive layer OP can be bonded with improved strength. The wire bonding step is accompanied with heat treatment, for example, at from 150 to 230° C. for about from 2 to 5 minutes. The heat load in this step is much smaller (meaning, much shorter in time) than that in the above-described heat treatment step (S4) and a heat treatment step (S9) described later and does not affect the grain boundary diffusion of nickel described later.

Next, a heat treatment step (S9) shown in FIG. 7 is performed.

Figure 19:
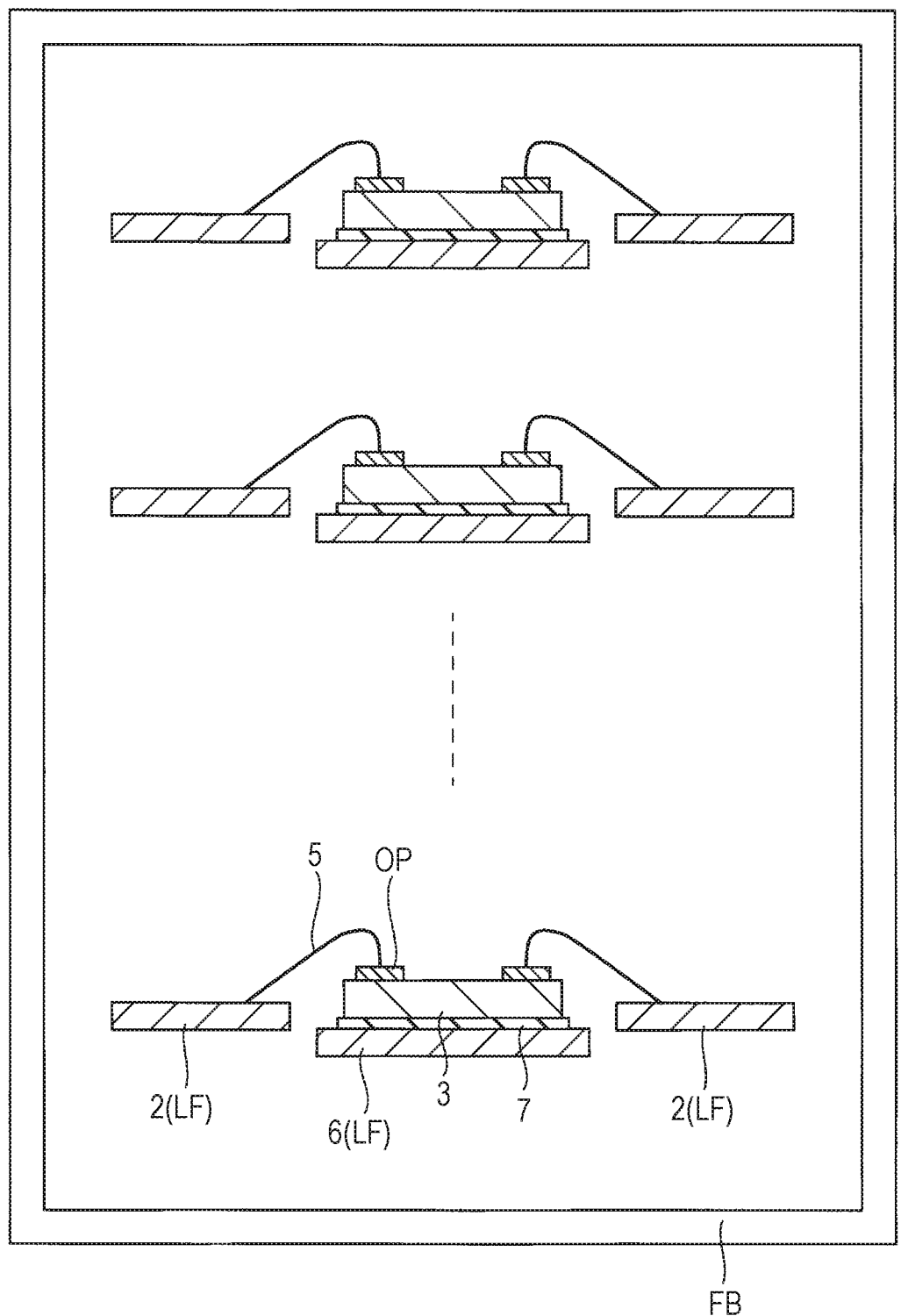
FIG. 19 is a cross-sectional view of the semiconductor device during a manufacturing step thereof following that of FIG. 18.

As shown in FIG. 19, a plurality of the semiconductor chips 3 is housed in a furnace body FB and heat treated, for example, under the conditions of 250° C., 16 hours, and air atmosphere. This heat treatment accelerates grain boundary diffusion of nickel. As shown in FIG. 6, nickel deposited on the surfaces (main surface and side surface) of the conductive layer 15 forms a nickel oxide layer. This nickel oxide layer corresponds to the metal oxide layer 14a shown in FIG. 6. The nickel exposed from (deposited on) the surface of the conductive layer (gold layer) 15 bonds to oxygen in the air to form this metal oxide layer 14a. As described above (refer to FIGS. 5 and 6), the metal oxide layer (nickel oxide layer) 14a is formed in a region other than the region (wire bonding region) R1, in other words, in only a region (sealing body bonding region) R2 exposed to oxygen in the air.

In the present embodiment, by this heat treatment, nickel is intentionally exposed from the main surface (more preferably, the main surface and the side surface) of the conductive layer (gold layer) 15 to form the metal oxide layer (nickel oxide layer) 14a. In addition, by this heat treatment step, the thickness of the alloy layer 17 formed in the above-described wire bonding step (S8) increases to several tens nm and the resulting layer contributes to improvement in bonding strength between the wire 5 and the conductive layer OP.

Next, a plasma cleaning step (S10) shown in FIG. 7 is performed.

Figure 20:
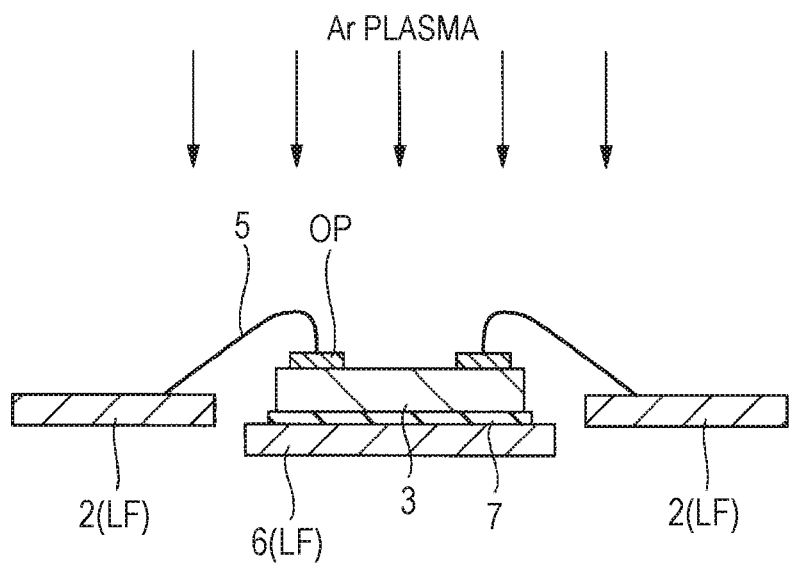
FIG. 20 is a cross-sectional view of the semiconductor device during a manufacturing step thereof following that of FIG. 19.

By exposing the leadframe LF (particularly, the conductive layer OP having the wire 5 connected therewith) on which the semiconductor chip 3 has been mounted to an argon (Ar) gas atmosphere, that is, by exposing the surface of the conductive layer OP (particularly, the conductive layer 15) formed on the pad electrode 4 of the semiconductor chip 3 to plasma (argon gas plasma) as shown in FIG. 20, the number of hydroxyl groups on the surface of the metal oxide layer 14a formed in the previous heat treatment step (S9) is increased. This makes it possible to further improve the adhesion (adhesiveness) between the conductive layer OP and the sealing body 1 formed by a resin sealing step (S11) described later. In the present embodiment, the plasma cleaning step (S10) performed after the heat treatment step (S9) but before a resin sealing step (S11) is described, but this plasma cleaning step is not always necessary, depending on the above-described thickness of the conductive layer (gold layer) 15 or the conditions in the above-described heat treatment step (S9).

Next, a resin sealing step (S11) shown in FIG. 7 is performed.

Figure 21:
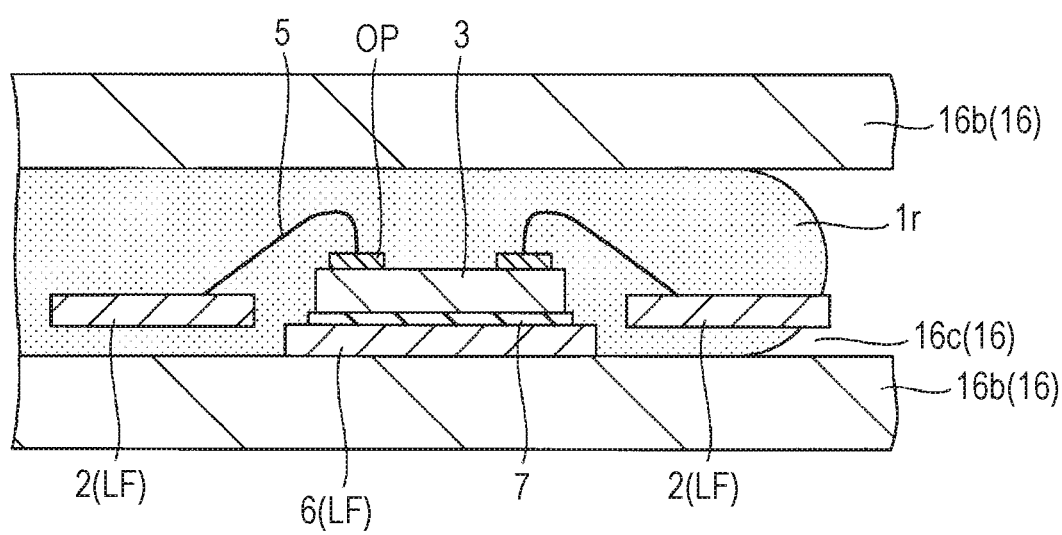
FIG. 21 is a cross-sectional view of the semiconductor device during a manufacturing step thereof following that of FIG. 20.

As shown in FIG. 21, a sealing body 1 shown in FIG. 2 is formed by installing the semiconductor chip 3 and the leadframe LF in a cavity 16c formed at a mating surface between an upper force 16a and a lower force 16b of a mold 16 and filling the cavity 16c with a resin (sealing resin) 1r. This resin 1r is comprised of, for example, an epoxy resin containing a silane coupling agent.

In the present embodiment, prior to the resin sealing step (more specifically, after the wire bonding step performed above), the conductive layer (gold layer) 15 exposed from the wire 5 has, on the surface thereof (particularly, the main surface having a large contact area with the sealing body 1), the metal oxide layer 14a. This facilitates improvement in adhesion between the sealing body 1 made of the resin 1r and the conductive layer OP (particularly, the conductive layer 15). In other words, separation of the sealing body 1 from the surface of the conductive layer (gold layer) 15 can be suppressed.

In the present embodiment, as shown in FIG. 21, the sealing body 1 is formed using, for example, transfer molding. Compression molding (a method of placing a molten resin in a cavity, immersing the semiconductor chip and the leadframe therein, and then curing the resin) may be used instead. When transfer molding is used, a lateral (horizontal direction) force (resin filling pressure) is applied to the wire 5 connected with the conductive layer OP on the pad electrode 4, while in compression molding, this lateral force is not applied to the wire 5 compared with transfer molding. By using compression molding for the formation of the sealing body 1, occurrence of a bonding failure of the wire can be suppressed further. Also in compression molding, it is important that the resin contains a silane coupling agent.

Next, the bonding mechanism between the sealing resin 1r and the metal oxide layer (nickel oxide layer) 14a formed on the surface of the conductive layer 15 will be described referring to FIGS. 22 to 23.

As described above, the conductive layer 15 has, on the main surface and side surface thereof, the nickel oxide layer after the heat treatment step (S9) shown in FIG. 7. This nickel oxide layer reacts with the water content in the air to have a hydroxyl group on the surface thereof.

FIG. 22 shows the chemical structure of a silane coupling agent and Y in this drawing represents a reactive functional group such as amino, epoxy, methacrylic, vinyl, or mercapto group and OR represents a hydrolyzable group such as $OCH_3$, $OC_2H_5$, or $OCOCH_3$ group. FIG. 23 shows the reaction mechanism between the silane coupling agent and the nickel oxide layer. First, the alkoxy group of the silane coupling agent reacts with a water content and hydrolyzes into a silanol group. It transfers to the surface of inorganic particles via hydrogen bonding with the hydroxyl group on the surface of inorganic particles. Then, after a dehydration condensation reaction, it forms a strong covalent bond with the inorganic particles. The inorganic particles shown in FIG. 23 correspond to the metal oxide layer 14a comprised of the nickel oxide layer shown in FIG. 6. This means improvement in the adhesion between the metal oxide layer formed on the main surface and side surface of the conductive layer 15 and the sealing body 1 containing the silane coupling agent. In short, adhesion between the conductive layer OP 1 and the sealing body 1 can be improved.

As described above, in the present embodiment, the thickness of the conductive layer 15 comprised of a gold layer and configuring the conductive layer OP has an important meaning. The gold layer should be thick enough to prevent the nickel of the conductive layer 14 from being exposed on the main surface of the conductive layer 15 comprised of a gold layer as a result of interfacial diffusion and forming a nickel oxide layer even when a heat load (heat treatment) is applied to the semiconductor chip 3 after the conductive layer OP formation step (S2) and before the wire bonding step (S8), each shown in FIG. 7. This means that it is important that nickel has not been deposited on the main surface of the conductive layer 15 in the wire bonding step (S8). In addition, it is important that nickel deposited on the main surface of the conductive layer 15 has already formed a nickel oxide layer when the resin sealing step (S11) shown in FIG. 7 is started.

FIG. 24 shows the analysis results of the surface of the gold layer (Au) when the thickness of the gold layer and baking (heat treatment) conditions are changed. It shows the results of detecting a nickel amount of the main surface of the conductive layer 15 by Auger electron spectroscopy (AES). Baking conditions at 250° C. for 16 hours correspond to, for example, those when the heat treatment step (S4) shown in FIG. 7 is performed, while those at 250° C. for 32 hours correspond to those when the heat treatment steps (S4 and S9) are performed. It has been revealed that, for example, when the gold film has a thickness of 1.5 μm, no nickel is detected from the main surface of the conductive layer 15 after the heat treatment step (S4) shown in FIG. 7 and nickel is detected after heat treatment at 250° C. for 16 hours is performed further in the heat treatment step (S9) shown in FIG. 7. In the present embodiment, when the thickness of the gold layer is set at about 1.5 μm, bonding strength between the wire 5 and the conductive layer OP and adhesion between the conductive layer OP and the sealing body 1 can be improved. When the gold film has a thickness of 1.0 μm, bonding strength, between the wire 5 and the conductive layer OP, of the semiconductor device having a nonvolatile memory cell according to the present embodiment may be deteriorated. When the gold film has a thickness of 2.0 μm, bonding strength between the wire 5 and the conductive layer OP is increased, but adhesion between the conductive layer OP and the sealing body 1 becomes insufficient. Therefore, the time of the heat treatment step (S9) must be increased.

The invention made by the present inventors has been described specifically based on the embodiment. It is however needless to say that the invention is not limited to the above-described embodiment and can be changed in various ways without departing from the gist of the invention. A plurality of modification examples will hereinafter be shown. These modification examples may be used in combination as needed.

In the above-described embodiment, a semiconductor chip having therein a nonvolatile memory cell has been described as an example. In a semiconductor chip having no nonvolatile memory cell therein, the conductive layer 15 may be made thinner (for example, from 0.5 to 1.0 μm) than the conductive layer 14 because the heat treatment step (S4) shown in FIG. 7 becomes unnecessary.

Modification Example 1

Modification Example 1 is a modification example of the conductive layer 15 of the above-described embodiment. Modification Example 1 is similar to the above-described embodiment except that the conductive layer 15 has a thick film portion and a thin film portion. Description on the members other than the conductive layer 15 is therefore omitted.

Figure 25:
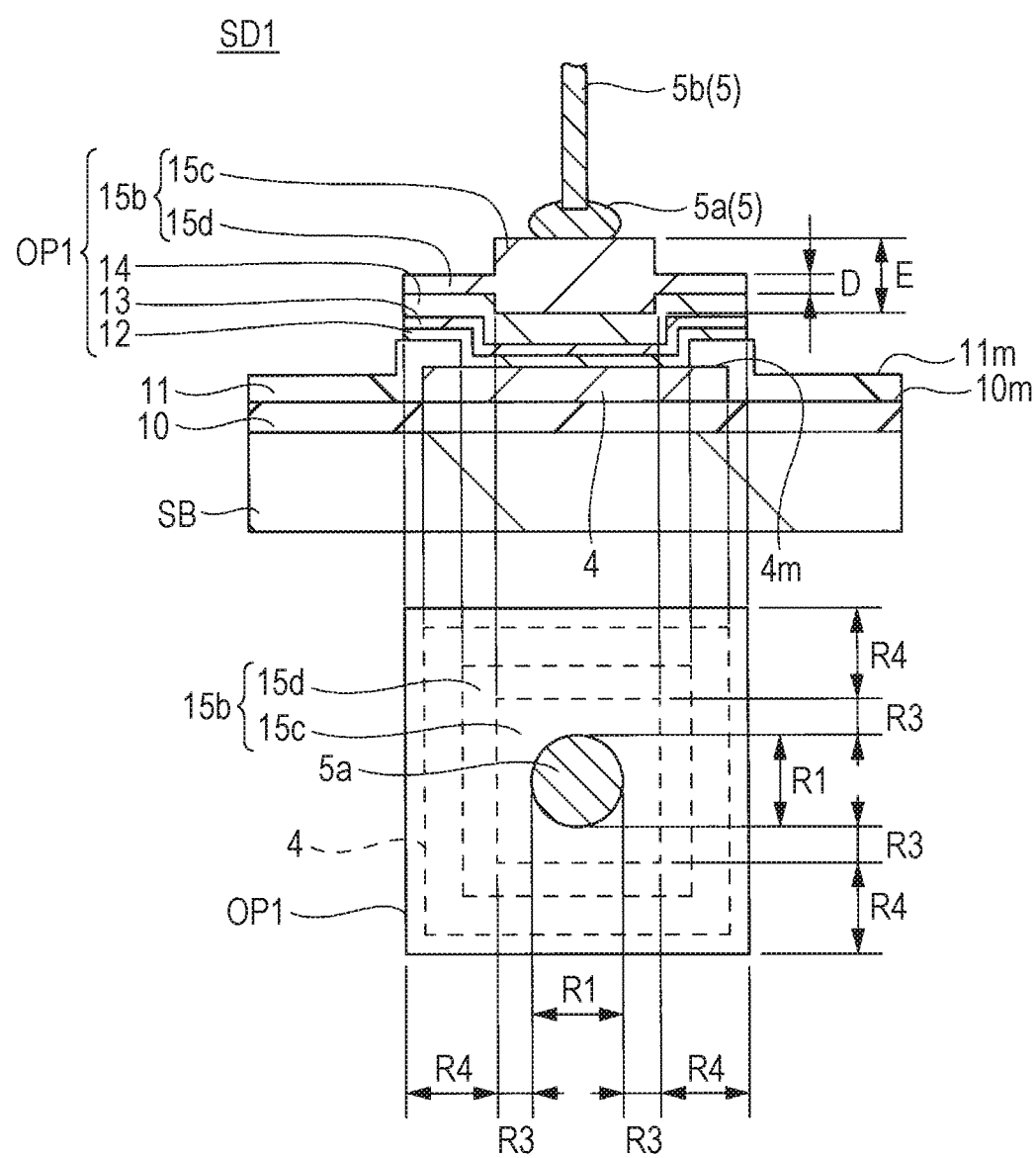
FIG. 25 is a fragmentary cross-sectional view of a semiconductor device of Modification Example 1.
Figure 26:
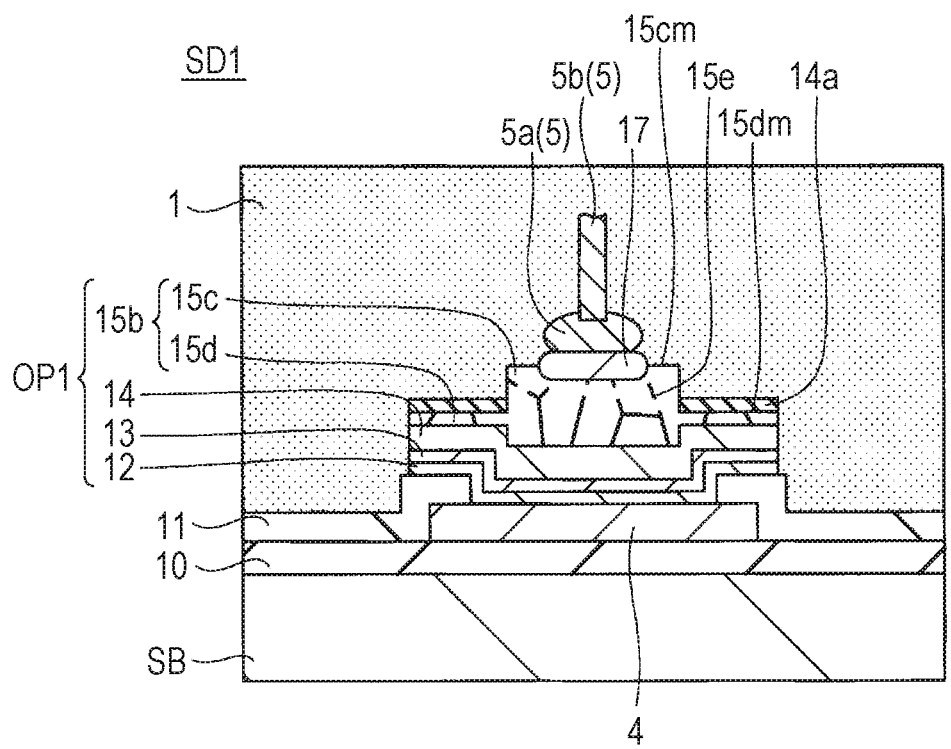
FIG. 26 is a fragmentary enlarged cross-sectional view of FIG. 25.
Figure 27:
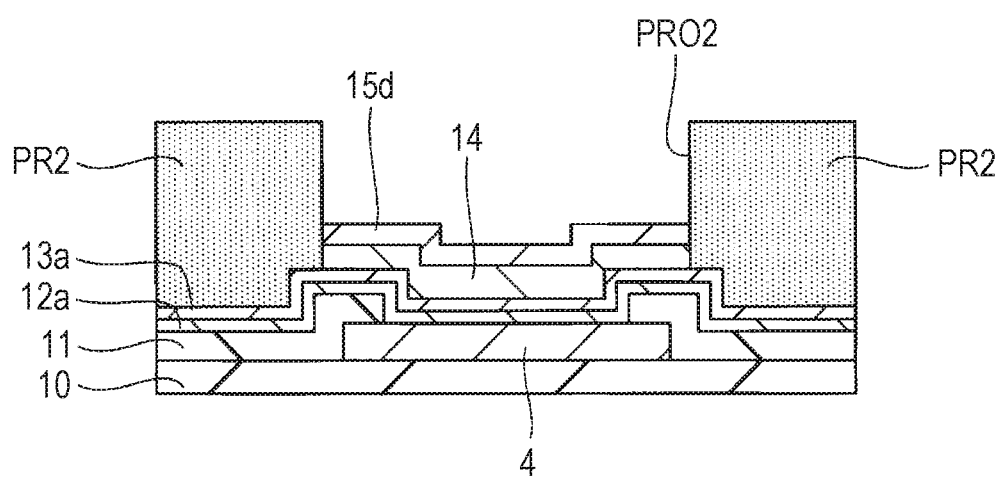
FIG. 27 is a cross-sectional view of the semiconductor device of Modification Example 1 during a manufacturing step thereof.
Figure 28:
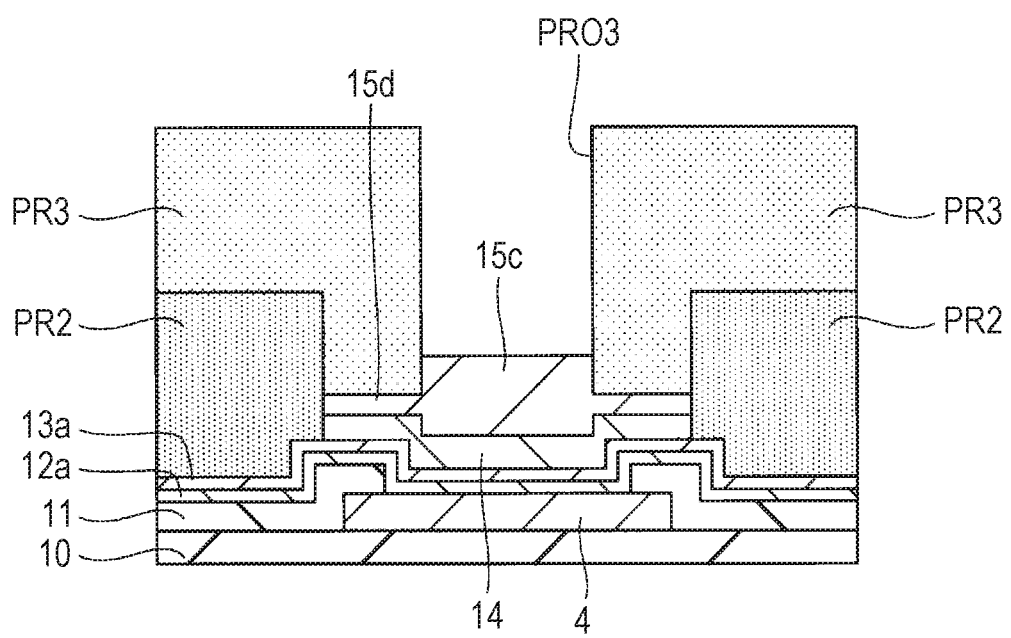
FIG. 28 is a cross-sectional view of the semiconductor device during a manufacturing step thereof following that of FIG. 27.
Figure 29:
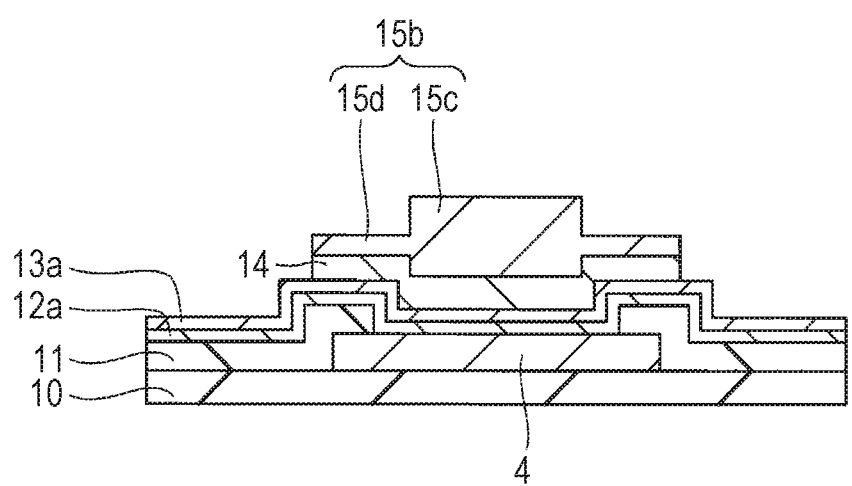
FIG. 29 is a cross-sectional view of the semiconductor device during a manufacturing step thereof following that of FIG. 28.

FIG. 25 is a fragmentary cross-sectional view of a semiconductor device SD1 of Modification Example 1. FIG. 26 is a fragmentary enlarged cross-sectional view of FIG. 25. FIGS. 27 to 29 are cross-sectional views showing the manufacturing steps of the semiconductor device SD1 of Modification Example 1.

FIG. 25 corresponds to FIG. 5 of the above-described embodiment, but it omits the polyimide layer PI and the sealing body 1 shown in FIG. 5. As shown in FIGS. 25 and 26, a conductive layer 15b made of gold (Au) has, in plan view, a thick film portion 15c at the center thereof and a thin film portion 15d that surrounds the thick film portion 15c. As shown in FIG. 25, the thick film portion 15c corresponds to regions R1 and R3, while the thin film portion 15d corresponds to a region R4. The bonding portion between the ball portion 5a of the wire 5 and the conductive layer 15b is the region (wire bonding region) R1 and this region is a portion of the thick film portion 15c. The bonding portion between the sealing body 1 and the conductive layer 15b is the region (sealing body bonding portion) R3 and the region (sealing body bonding portion) R4. The region R3 is a portion of the thick film portion 15c, while the region R4 corresponds to the thin film portion 15d.

As the cross-sectional view of FIG. 25 shows, the thick film portion 15c of the conductive layer 15b has a thickness E, which is greater than a thickness D of the thin film portion 15d. As shown in FIG. 26, the thin film portion 15d has, on the main surface 15dm thereof, a metal oxide layer (nickel oxide layer) 14a. The thick film portion 15c has, on the main surface 15cm thereof, no metal oxide layer 14a. In the thick film portion 15c of the conductive layer 15b shown in FIG. 26, interfacial diffusion of nickel coming from the conductive layer (nickel layer) 14 occurs in a portion where a grain boundary 15e is shown by a solid line, while no diffusion occurs in a portion shown by a broken line. This means that the region R1 shown in FIG. 26 is a bonding region between the wire 5 and the conductive layer 15b and it has therein the alloy layer 17 as shown in FIG. 26. In the regions R1 and R3, the conductive layer 15c has, on the main surface 15cm thereof, no metal oxide layer 14a. The region R4, on the other hand, has therein the metal oxide layer 14a. In Modification Example 1, it is important that in plan view, the entire bonding region between the wire 5 and the conductive layer 15b is formed in the thick film portion 15c, because when the ball portion 5a protrudes to the thin film portion 15d of the region R4, the bonding strength between the ball portion 5a of the wire 5 and the conductive layer 15b decreases.

In Modification Example 1, the heat treatment step (S9) of the above-described embodiment shown in FIG. 7 can be omitted by adjusting the respective thicknesses of the thick film portion 15c and the thin film portion 15d. Described specifically, nickel is deposited on the main surface of the thin film portion 15d and a metal oxide layer 14a is formed thereon in the heat treatment step (S4). However, no nickel is deposited on the main surface of the thick film portion 15c and no metal oxide layer 15a is formed thereon. Since the thick film portion 15c has no metal oxide layer 14a thereon, the wire 5 and the conductive layer 15b can be bonded with improved bonding strength in the wire bonding step (S8) shown in FIG. 7. Further, in the resin sealing step (S11) of FIG. 7, the metal oxide layer 14a formed on the thin film portion 15d can improve the adhesive force between the sealing body 1 and the conductive layer.

Reference to FIG. 24 of the above-described embodiment has revealed that it is necessary to adjust the thickness of the thin film portion 15d to 1.0 μm and that of the thick film portion 15c to 1.5 μm or more.

Next, a method of manufacturing the conductive layer 15b of Modification Example 1 will be described.

FIG. 27 corresponds to FIG. 12 of the above-described embodiment. After formation of a photoresist layer PR2 having therein an opening PRO2 on a conductive layer 13a, a conductive layer (nickel layer) 14 and a conductive layer (gold layer) 15d are formed successively in the opening PRO2 by electroplating. At this time, the gold layer formed on the conductive layer 14 has a thickness corresponding to that of the thin film portion 15d.

Next, as shown in FIG. 28, a thick film portion 15c is formed by forming a photoresist layer PR3 having an opening PRO3 corresponding to the thick film portion 15c and then forming a conductive layer (gold layer) in the opening portion PRO3 further by electroplating.

Then, as shown in FIG. 29, the photoresist layers PR2 and PR3 are removed. Similar to the above-described embodiment, a conductive layer OP1 shown in FIG. 25 is formed by removing the conductive layer (copper layer) 13a and the conductive layer (chromium layer) 12a in a region exposed from the conductive layer 15b and the conductive layer 14.

Modification Example 2

Modification Example 2 is a modification example of the above-described embodiment and Modification Example 1. Here, it will be described as a modification example of the above-described embodiment.

Figure 30:
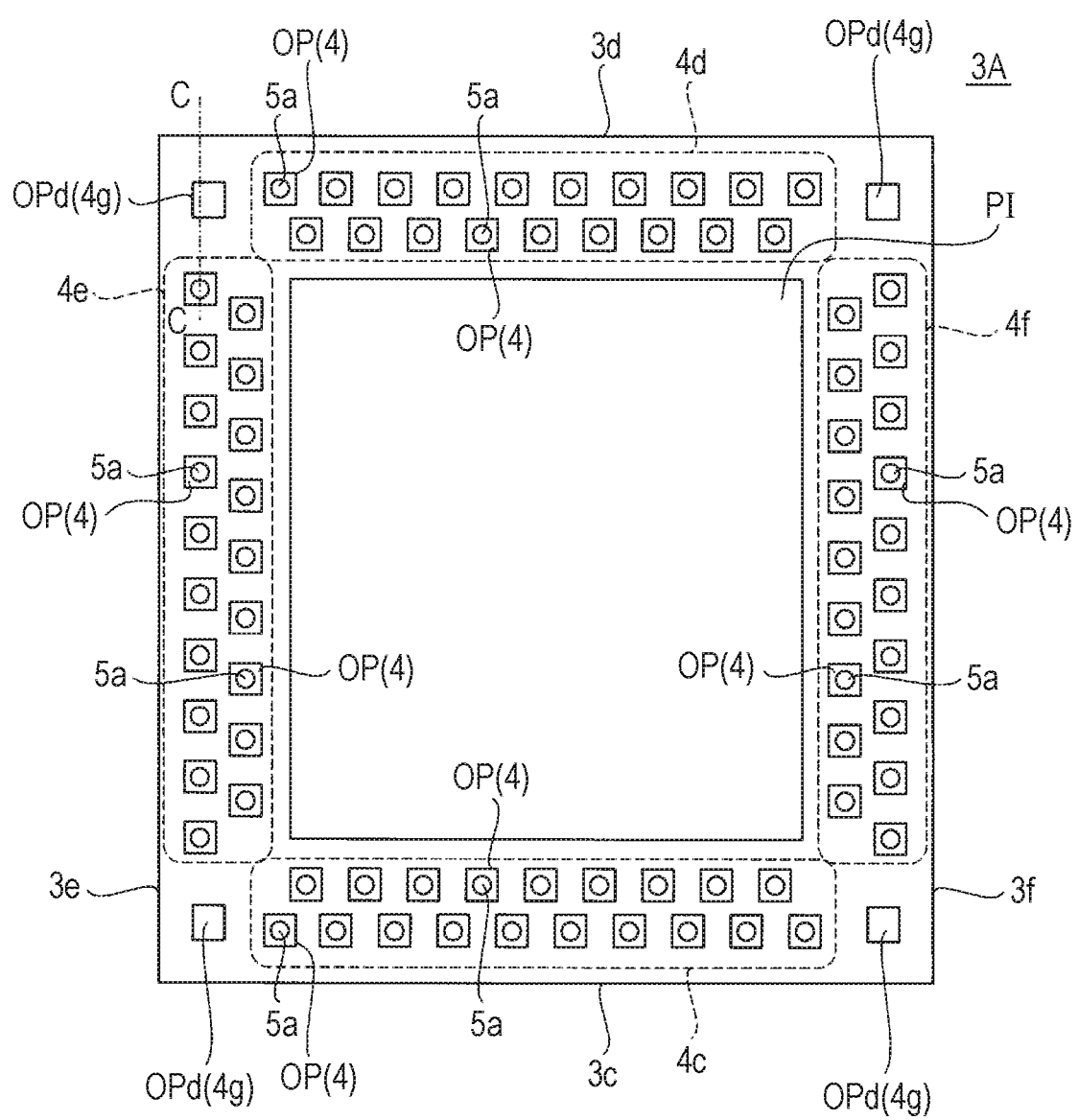
FIG. 30 is a plan view of a semiconductor chip of Modification Example 2.
Figure 31:
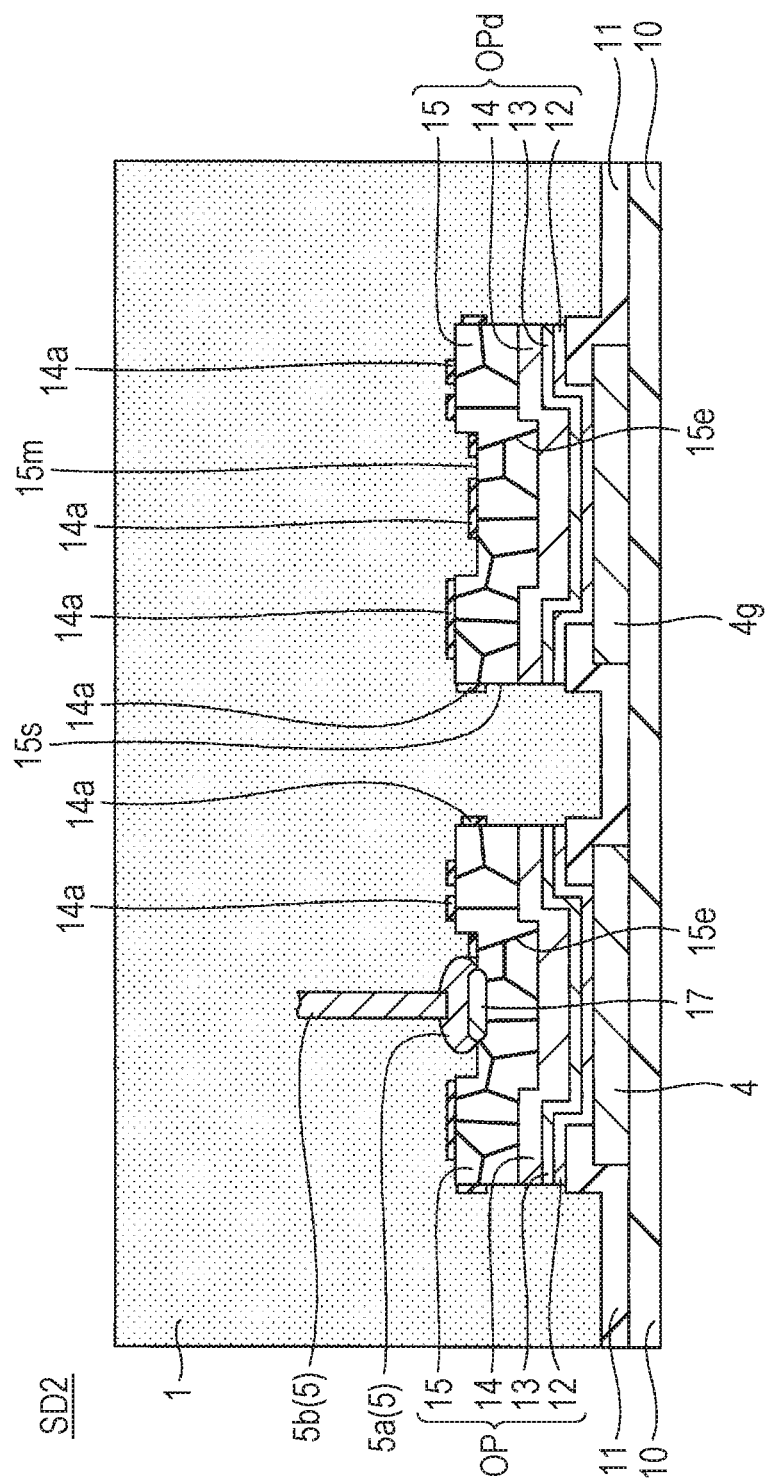
FIG. 31 is a cross-sectional view taken along the line C-C of FIG. 30.

FIG. 30 is a plan view of a semiconductor chip of Modification Example 2. FIG. 31 is a cross-sectional view taken along the line C-C of FIG. 30. As shown in FIG. 30, a semiconductor chip 3A of Modification Example 2 has, at the corner portion thereof, a dummy pad electrode 4g and a dummy conductive layer OPd. The corner portion of the semiconductor chip 3A is a region sandwiched, for example, between pad electrode groups 4d and 4e running along sides 3d and 3e orthogonal to each other.

As shown in FIG. 31, a semiconductor device SD2 of Modification Example 2 has a structure comprised of the pad electrode 4, the conductive layer OP, and the wire 5 of the above-described embodiment and another structure comprised of the dummy pad electrode 4g and the dummy conductive layer OPd. The wire 5 is not connected with the dummy conductive layer OPd and the entirety of the main surface 15m of the conductive layer 15 is in contact with the sealing body 1. The dummy pad electrode 4g and the dummy conductive layer OPd have a cross-sectional structure similar to that of the pad electrode 4 and the conductive layer OP. Described specifically, a conductive layer 15 comprised of gold and configuring the dummy conductive layer OPd has, on the main surface 15m and the side surface 15s thereof, a metal oxide layer 14a, which improves the adhesion between the sealing body 1 and the dummy conductive layer OPd. They may be different in planar shape. In particular, the dummy conductive layer OPd may have a planar shape either greater or smaller than that of the conductive layer OP.

The dummy conductive layer OPd is provided to improve the adhesion between the semiconductor chip 3A and the sealing body 1. In other words, the adhesion between the semiconductor chip 3A and the sealing body 1 can be improved by providing the dummy conductive layer OPd at the corner portion of the semiconductor chip 3A.

Modification Example 3

Modification Example 3 is an example of mounting the semiconductor chip of the above-described embodiment, Modification Example 1 or Modification Example 2 on a BGA (ball grid array) package and it will be described using the above-described embodiment as an example. More specifically, an example of using a wiring board WB as a base material on which a semiconductor chip 3 is to be mounted will be described.

Figure 32:
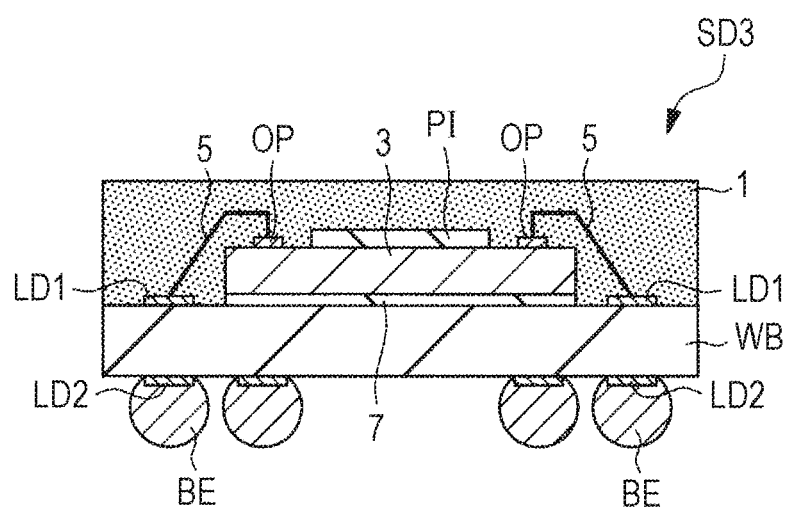
FIG. 32 is a cross-sectional view of a semiconductor device of Modification Example 3.

FIG. 32 is a cross-sectional view of a semiconductor device of Modification Example 3. The semiconductor device SD3 of Modification Example 3 has the wiring board WB, the semiconductor chip 3, a sealing body 1, and a solder ball electrode BE. The wiring board WB has, on the main surface thereof, the semiconductor chip 3 via an adhesive layer 7 and a plurality of conductive layers OP formed on the main surface of the semiconductor chip 3 is connected, via a wire 5, with a terminal electrode LD1 formed on the main surface of the wiring board WB. The semiconductor chip 3 has, on the main surface thereof, a polyimide layer PI and the semiconductor chip 3, the polyimide layer PI, the conductive layer OP, the wire 5, and the terminal electrode LD1 are covered with the sealing body 1. Further, the wiring board WB has, on the back surface thereof, a plurality of terminal electrodes LD2 connected with the terminal electrode LD1 and a solder ball electrode BE is connected with the terminal electrode LD2.

In Modification Example 3, it is preferred to set the temperature of the heat treatment step (S9) of the above-described embodiment shown in FIG. 7 at 200° C. or less in consideration of the warpage of the wiring board WB caused by heat. In other words, it is preferred to carry out the heat treatment step (S9) at a temperature lower than that used in the method of manufacturing a semiconductor device using a leadframe.

The above-described embodiment includes the following modes.

Appendix 1

A semiconductor device having:
a semiconductor substrate;
a first pad electrode formed on the semiconductor substrate;
a conductive layer having a first layer made of a nickel layer formed on the first pad electrode and a second layer made of a gold layer formed on the first layer;
a wire comprised of copper connected with the main surface of the second layer; and
a sealing body that covers the conductive layer and the wire, in which the main surface of the second layer has a first region to which the wire is bonded and a second region which is a region other than the first region and having a nickel oxide layer formed therein, and in which, in the second region, the sealing body is in contact with the main surface of the second layer.

Appendix 2

The semiconductor device described in Appendix 1, in which the first region has therein an alloy layer of gold and copper, and in which the second region has a shape that surrounds the periphery of the first region in plan view.

Appendix 3

The semiconductor device described in Appendix 1, in which the second layer has a side surface having thereon the nickel oxide layer, and in which the side surface is in contact with the sealing body.

Appendix 4

The semiconductor device described in Appendix 1, in which the first pad electrode is comprised of aluminum.

Appendix 5

The semiconductor device described in Appendix 1, in which the sealing body is comprised of an epoxy resin containing a silane coupling agent.

Appendix 6

The semiconductor device described in Appendix 1, in which the semiconductor substrate has in plan view:

a first side, a second side facing to the first side, a third side that connects the first side with the second side, and a fourth side facing to the third side;

a first pad electrode group having a plurality of the first pad electrodes formed over the semiconductor substrate and arranged along the first side;

a second pad electrode group having a plurality of the first pad electrodes formed over the semiconductor substrate and arranged along the second side;

a third pad electrode group having a plurality of the first pad electrodes formed over the semiconductor substrate and arranged along the third side; and a fourth pad electrode group having a plurality of the first pad electrodes formed over the semiconductor substrate and arranged along the fourth side.

Appendix 7

The semiconductor device described in Appendix 6, further having a polyimide layer formed in a region surrounded, in plan view, with the first pad electrode group, the second pad electrode group, the third pad electrode group, and the fourth pad electrode group and being in contact with the sealing body.

Appendix 8

The semiconductor device described in Appendix 1, further having:

a second pad electrode formed over the semiconductor substrate; and a conductive layer having a third layer comprised of a nickel layer and formed over the second pad electrode, and a fourth layer comprised of a gold layer and formed over the third layer, in which the entirety of the main surface of the fourth layer is in contact with the sealing body.

Appendix 9

The semiconductor device described in Appendix 8, in which the semiconductor substrate has, in plan view, a rectangular main surface, and in which the second pad electrode is arranged at the corner portion of the rectangular main surface.

What is claimed is:

1. A method of manufacturing a semiconductor device, comprising the steps of:
   (a) providing a semiconductor wafer having a semiconductor chip including:
   a semiconductor substrate,
   a pad electrode formed over the semiconductor substrate, and
   a conductive layer including:
   a first layer comprised of a nickel layer and formed over the pad electrode, and
   a second layer comprised of a gold layer and formed over the first layer;
   (b) connecting a wire comprised of copper with the conductive layer;
   (c) after the step (b), performing a first heat treatment to the semiconductor chip; and
   (d) after the step (c), sealing the semiconductor chip and the wire with a resin, and forming a sealing body,
   wherein a main surface of the second layer has a first region to which the wire is bonded, and a second region other than the first region,
   wherein, in the second region, the sealing body is in contact with the main surface of the second layer, and
   wherein in the step (c), a nickel oxide layer is formed in the second region by depositing nickel from the first layer on the main surface of the second layer.

2. The method of manufacturing a semiconductor device according to claim 1,
   wherein the resin has an epoxy resin containing a silane coupling agent.

3. The method of manufacturing a semiconductor device according to claim 1,
   wherein in the step (b), in the first region, no nickel is deposited from the first layer on the main surface of the second layer and an alloy layer of copper and gold is formed over the main surface of the second layer.

4. The method of manufacturing a semiconductor device according to claim 1,
   wherein the step (c) is performed while storing a plurality of the semiconductor chips in a furnace body.

5. The method of manufacturing a semiconductor device according to claim 4,
   wherein the step (c) is performed at a temperature of 250 □C for 16 hours.

6. The method of manufacturing a semiconductor device according to claim 1, further comprising, between the steps (c) and (d), a step of:
- (e) performing an argon plasma treatment to the main surface of the second layer.

7. The method of manufacturing a semiconductor device according to claim 1,
wherein the semiconductor chip has therein a nonvolatile memory element,
the method further comprising, between the steps (a) and (b), a step of:
- (f) performing a second heat treatment to the semiconductor chip, and wherein in the step (b), in the first region, no nickel is deposited from the first layer on the main surface of the second layer and an alloy layer of copper and gold is formed over the main surface of the second layer.

8. A method of manufacturing a semiconductor device, comprising the steps of:
- (a) providing a semiconductor chip,
the semiconductor chip including a pad electrode and a conductive layer formed over the pad electrode and connected with the pad electrode,
the conductive layer including a first metal layer and a second metal layer formed over the first metal layer and contacted with the first metal layer,
the pad electrode being comprised of a material softer than the first metal layer,
the first metal layer being comprised of nickel as a main component,
the second metal layer being comprised of gold as a main component, and
the second metal layer being an uppermost layer of the conductive layer;
- (b) after the step (a), electrically connecting a wire to the pad electrode of the semiconductor chip via the conductive layer,
the wire being comprised of copper as a main component;
- (c) after the step (b), baking the semiconductor chip and thereby forming an oxide film in a region which is of a surface of the second metal layer configuring the conductive layer and with which the wire is not in contact; and
- (d) after the step (c), sealing the semiconductor chip and the wire with a resin, and bringing the resin into contact with the oxide film.

9. The method of manufacturing a semiconductor device according to claim 8,
wherein the semiconductor chip provided in the step (a) further has a semiconductor substrate and a memory circuit formed over the main surface of the semiconductor substrate,
wherein the second metal layer has a thickness equal to or greater than the thickness of the first metal layer, and
wherein after the step (a) but before the step (b), the semiconductor chip is baked.

10. The method of manufacturing a semiconductor device according to claim 8,
wherein after the step (c) but before the step (d), plasma is exposed to the surface of the second metal layer.

* * * * *